United States Patent
Batchelor et al.

(10) Patent No.: US 12,237,310 B2
(45) Date of Patent: Feb. 25, 2025

(54) DISAGGREGATED TRANSISTOR DEVICES

(71) Applicant: X-Celeprint Limited, Dublin (IE)

(72) Inventors: William Edward Batchelor, Raleigh, NC (US); Ronald S. Cok, Rochester, NY (US)

(73) Assignee: X-Celeprint Limited, Dublin (IE)

( * ) Notice: Subject to any disclaimer, the term of this patent is extended or adjusted under 35 U.S.C. 154(b) by 551 days.

(21) Appl. No.: 17/526,874

(22) Filed: Nov. 15, 2021

(65) Prior Publication Data
US 2023/0154899 A1 May 18, 2023

(51) Int. Cl.
  *H01L 25/16* (2023.01)
  *H01L 23/48* (2006.01)
  *H01L 25/07* (2006.01)

(52) U.S. Cl.
  CPC .......... *H01L 25/071* (2013.01); *H01L 23/481* (2013.01); *H01L 25/16* (2013.01)

(58) Field of Classification Search
  CPC ..... H01L 25/071; H01L 23/481; H01L 25/16; H01L 21/6835; H01L 23/3171; H01L 25/0657; H01L 23/66; H01L 24/13; H01L 25/0655; H01L 25/50; H01L 2221/68363
  See application file for complete search history.

(56) References Cited

U.S. PATENT DOCUMENTS

| | | |
|---|---|---|
| 5,889,302 A | 3/1999 | Liu |
| 6,462,364 B1 | 10/2002 | Horiuchi |
| 7,307,298 B2 | 12/2007 | Yamane et al. |
| 7,547,917 B2 | 6/2009 | Gauthier, Jr. et al. |
| 7,622,367 B1 | 11/2009 | Nuzzo et al. |
| 8,394,116 B2 | 3/2013 | Kota et al. |
| 8,506,867 B2 | 8/2013 | Menard |
| 8,686,428 B1 | 4/2014 | Sekar et al. |
| 8,722,458 B2 | 5/2014 | Rogers et al. |
| 8,835,940 B2 | 9/2014 | Hu et al. |
| 8,933,433 B2 | 1/2015 | Higginson et al. |
| 9,520,537 B2 | 12/2016 | Bower et al. |
| 9,741,906 B2 | 8/2017 | Tischler et al. |
| 10,037,985 B2 | 7/2018 | De Winter et al. |
| 10,468,363 B2 | 11/2019 | Prevatte et al. |
| 11,152,395 B1 | 10/2021 | Carr et al. |

(Continued)

FOREIGN PATENT DOCUMENTS

JP  2009-081478 A  4/2009

*Primary Examiner* — Elias Ullah
(74) *Attorney, Agent, or Firm* — Choate, Hall & Stewart LLP; Michael D. Schmitt

(57) ABSTRACT

A multi-component transistor structure includes components each comprising an individual, discrete, and separate component substrate and a component transistor. The component transistor includes a transistor element having a transistor element resistance. A component connection is disposed external to the transistor element and has a connection resistance. The component connection electrically connects the transistor elements in the components in parallel. The connection resistance is less than the transistor element resistance of at least one corresponding transistor element, less than an average of the transistor element resistances of all of the corresponding transistor elements, or less than the sum of all of the transistor element resistances of all of the corresponding transistor elements. The component transistors are functionally similar and at least one of the components is disposed on another different one of the components in a component stack.

20 Claims, 23 Drawing Sheets

(56) References Cited

U.S. PATENT DOCUMENTS

| | | |
|---|---|---|
| 11,705,457 B2 | 7/2023 | Carr et al. |
| 2004/0014299 A1 | 1/2004 | Moriceau et al. |
| 2016/0093600 A1 | 3/2016 | Bower et al. |
| 2016/0380154 A1 | 12/2016 | Machuca et al. |
| 2017/0048976 A1 | 2/2017 | Prevatte et al. |
| 2017/0338216 A1 | 11/2017 | De Winter et al. |
| 2018/0042110 A1 | 2/2018 | Cok |
| 2021/0098425 A1 | 4/2021 | Lee et al. |
| 2023/0230958 A1 | 7/2023 | Batchelor et al. |
| 2023/0402462 A1 | 12/2023 | Carr et al. |

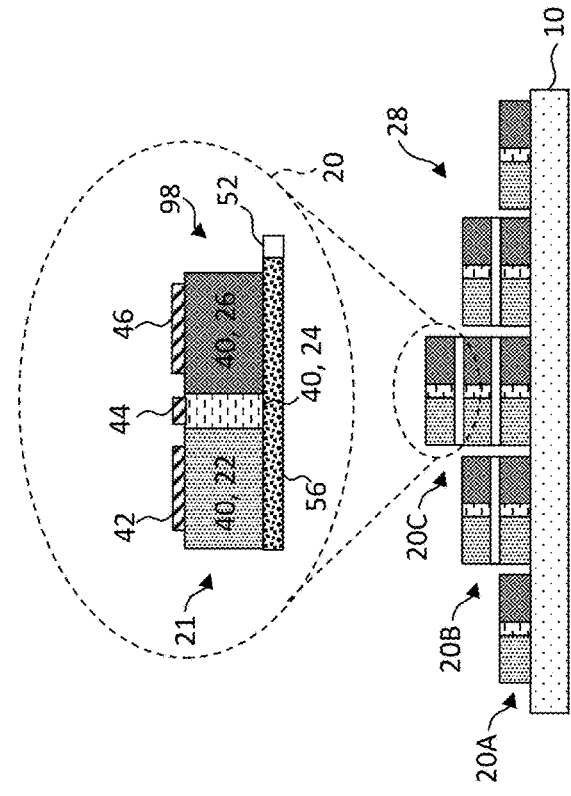
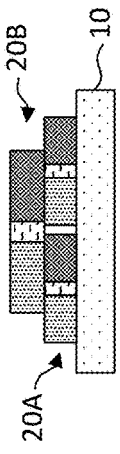
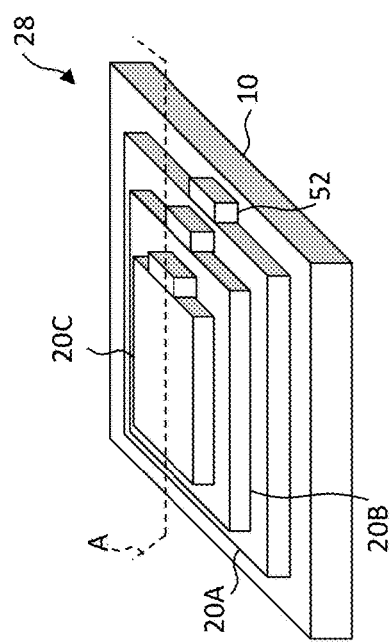
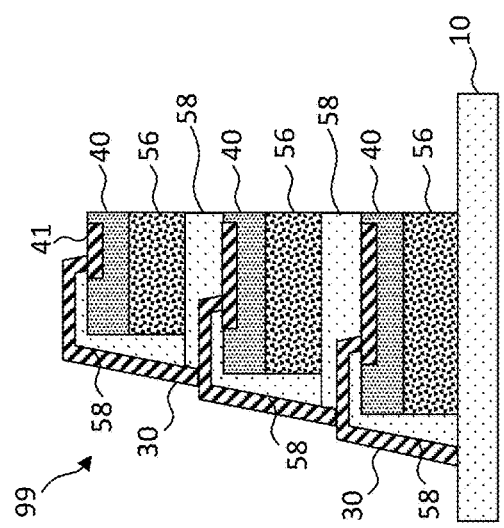
FIG. 1A
FIG. 1B
FIG. 1C
FIG. 1D

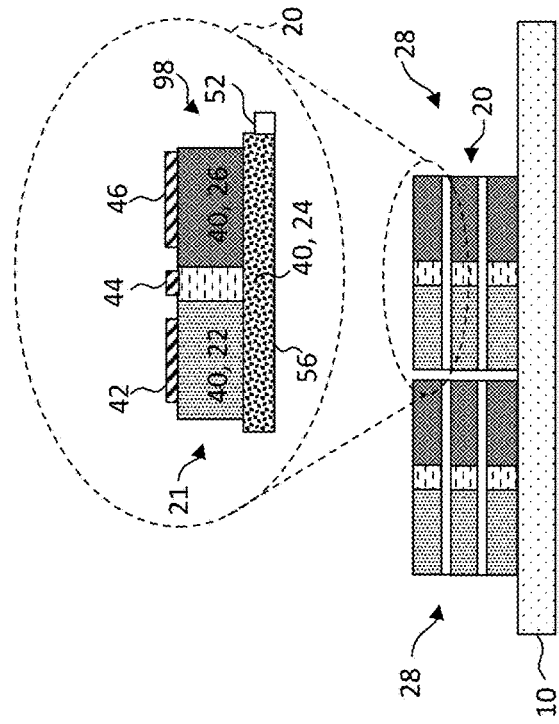
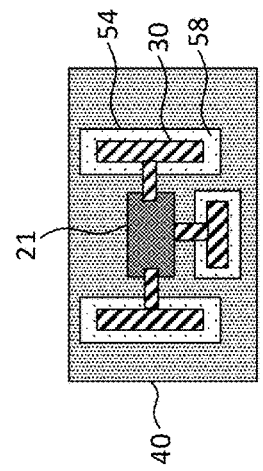
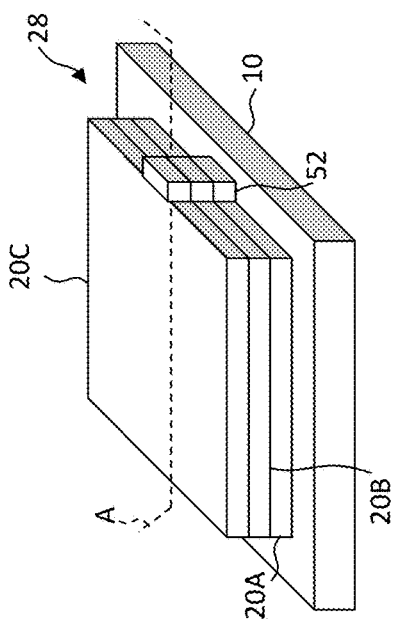
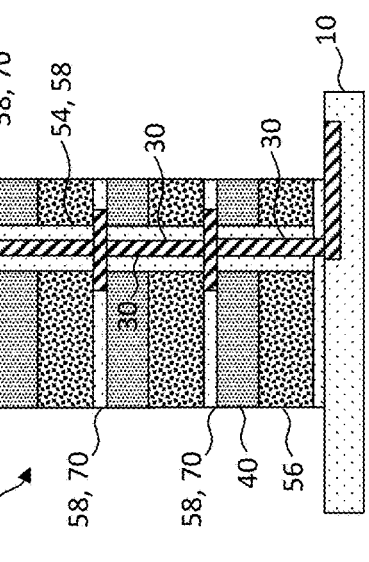
FIG. 2A
FIG. 2B
FIG. 2C
FIG. 2D

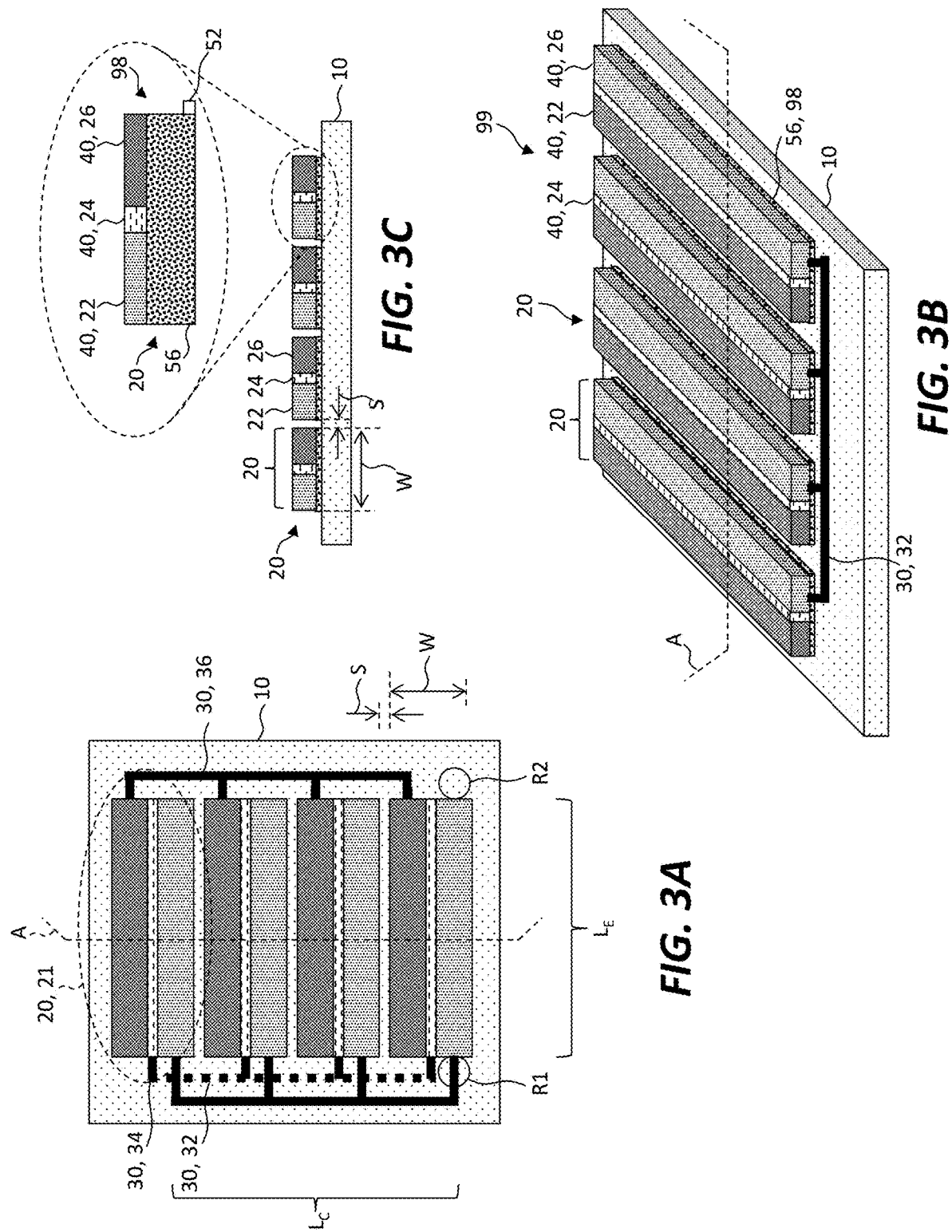

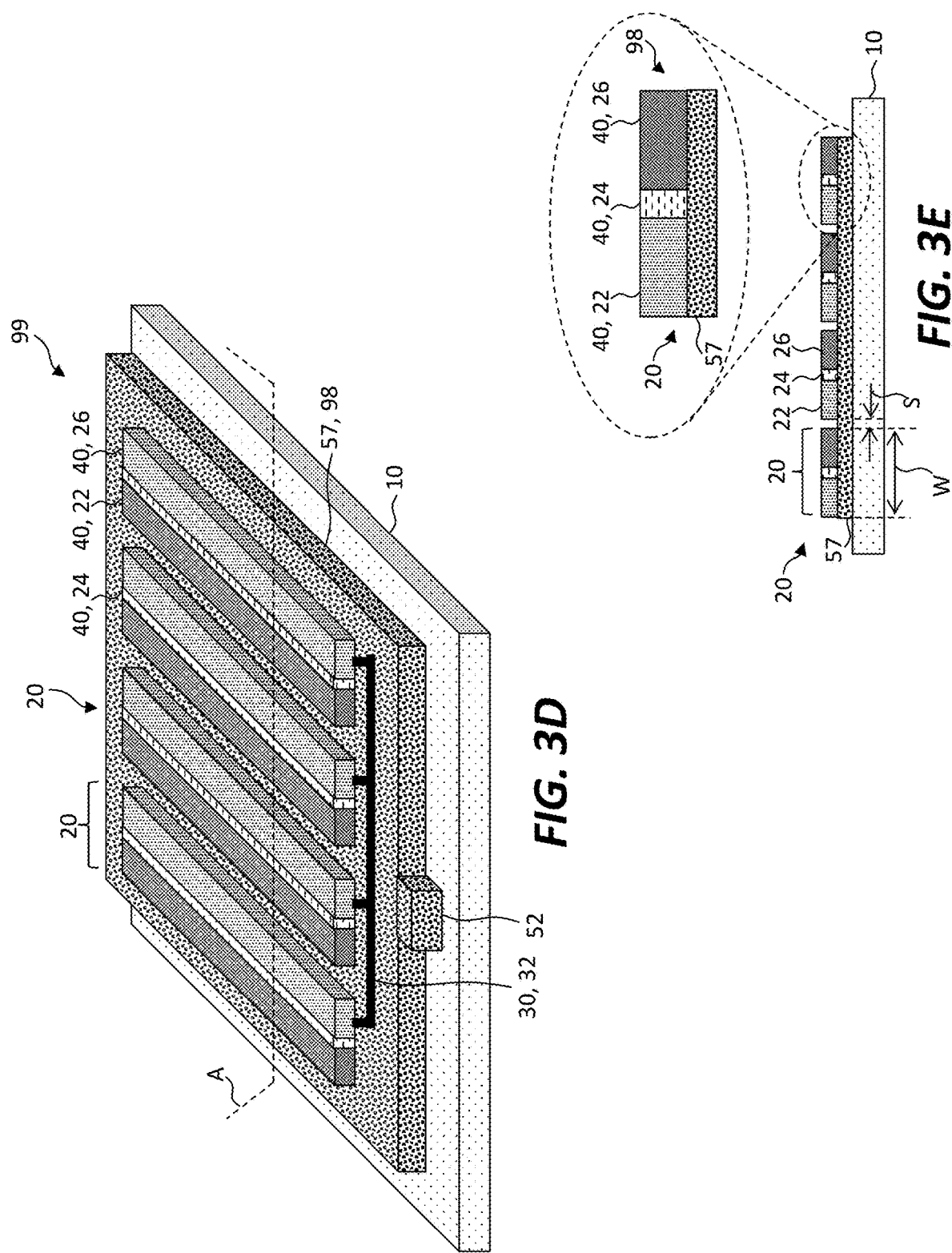

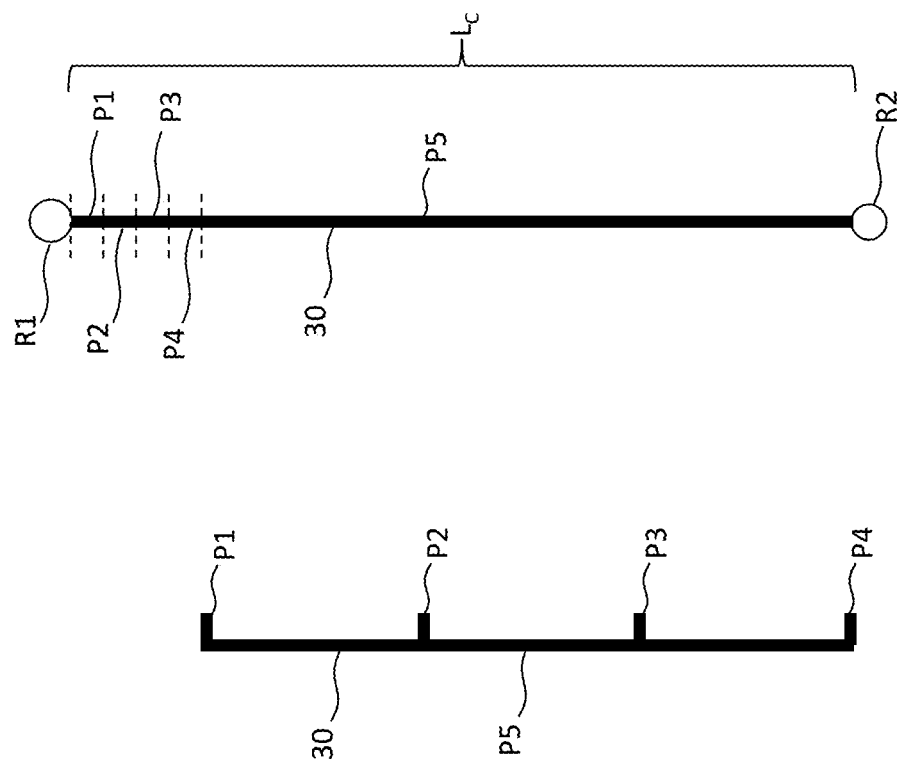

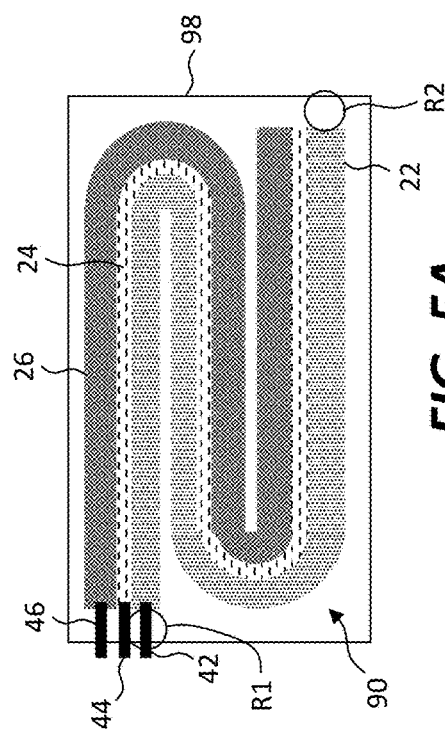
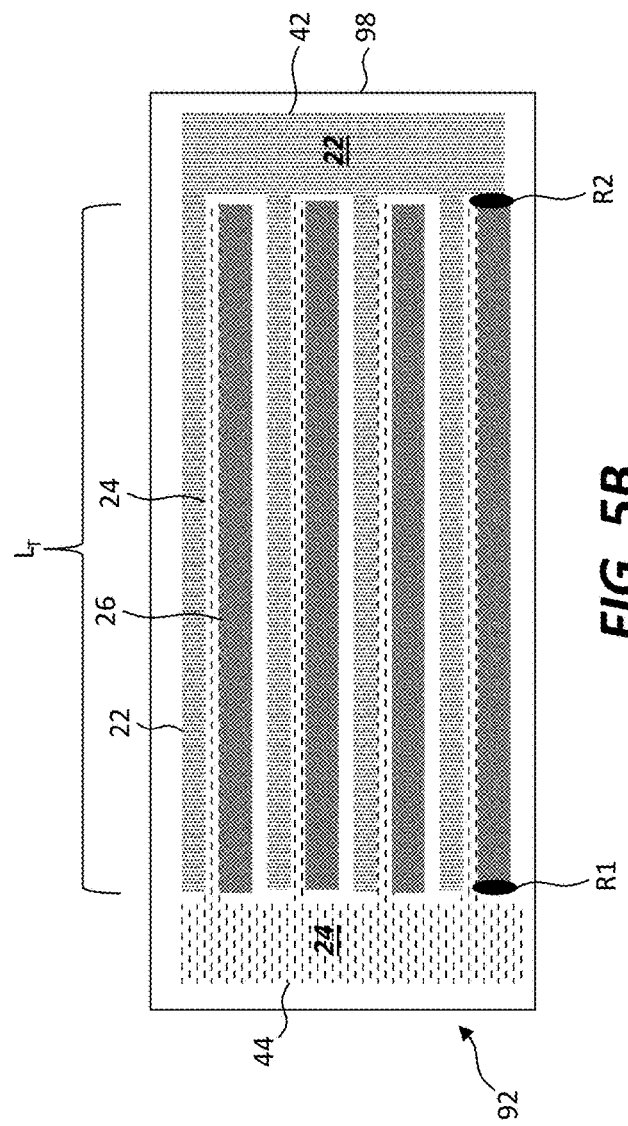
FIG. 5A
FIG. 5B

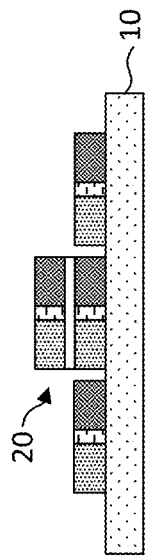
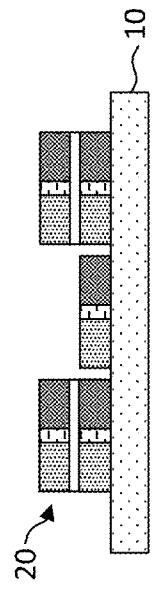
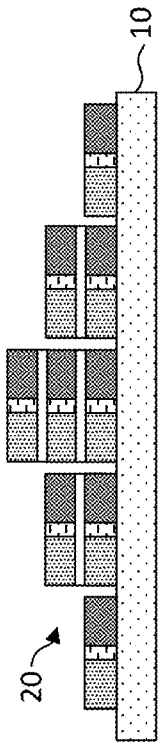
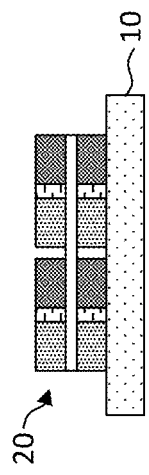
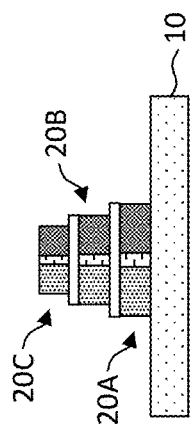

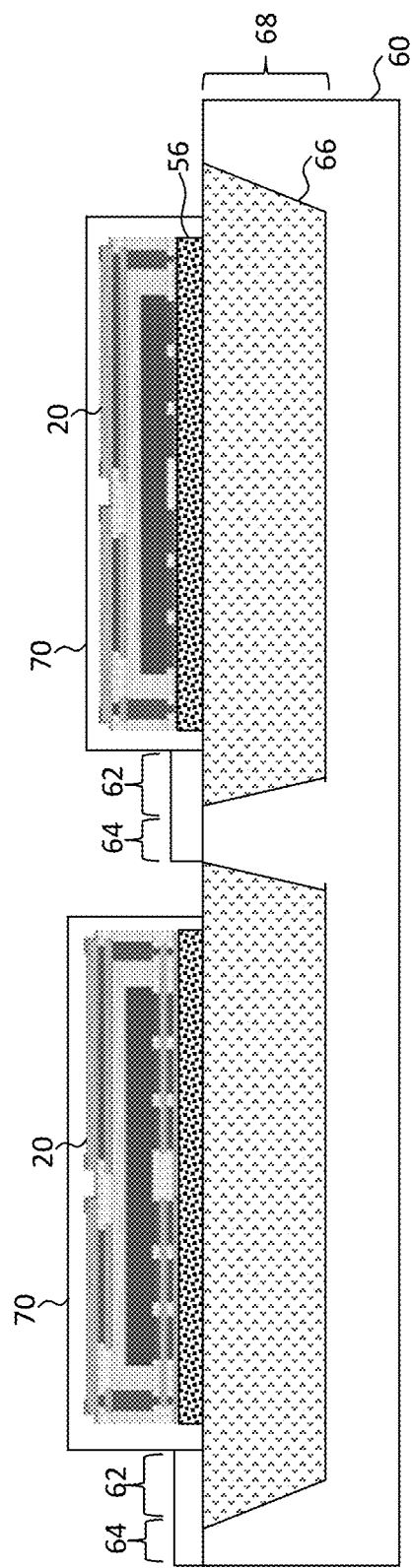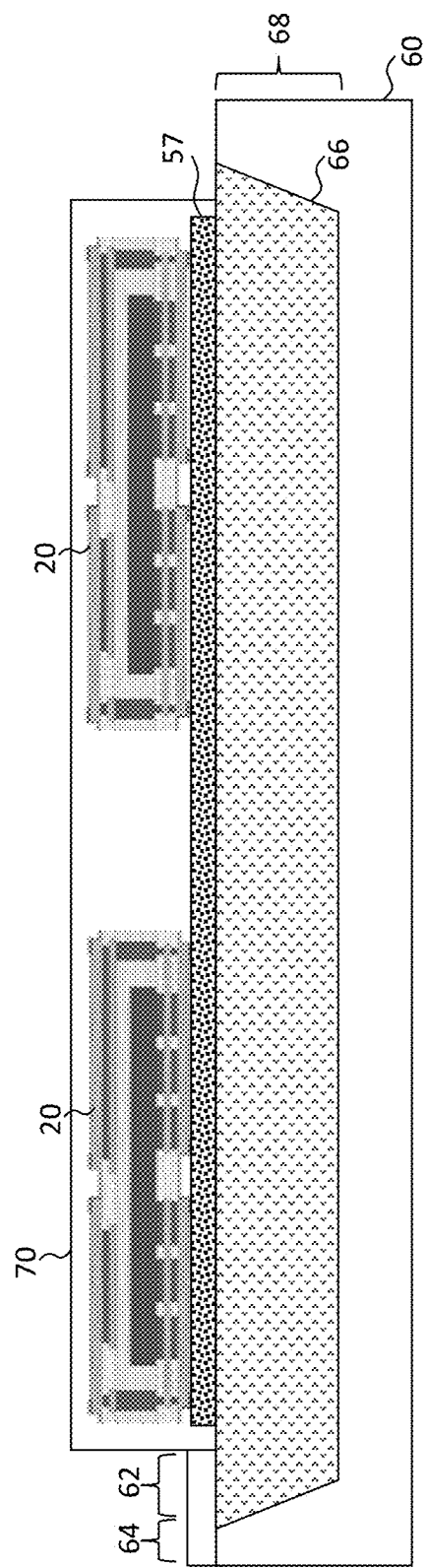
FIG. 10A
FIG. 10B

DISAGGREGATED TRANSISTOR DEVICES

TECHNICAL FIELD

The present disclosure relates to electronic devices comprising transistors, for example constructed using microtransfer printing.

BACKGROUND

Electronic circuits are widely used in communication, control, and sensing systems. In particular, transistors such as power transistors, are found in many electronic devices. Such transistors are typically larger than those typically found in logic circuits, have different frequency requirements, are typically used in analog circuits, can conduct relatively large currents compared to logic circuits, and can comprise compound semiconductor materials. Because such transistors can switch relatively large currents, they are provided with an extensive interface between the source and drain portions controlled by the gate of the transistor so as to reduce the current density of the transistor. A reduction in current density reduces local heating and damage to the transistor materials, thereby increasing device lifetime and functionality.

Large-current-transistor heating is often a limiting factor in the practical application of such devices and the heating is in part due to resistive heating in the transistor materials, including resistive heating in the gate, the source, and the drain of the transistor. The extensive interface between source and drain portions of a power transistor requires that electrical current physically travels along the interface, creating resistive heat. Moreover, because the source and drain materials are not perfectly conductive, current will be unevenly distributed over the source-drain interface, with a greater current density near the external connections of the power transistor, further exacerbating transistor heating and material breakdown.

U.S. Pat. No. 10,037,985 entitled Compound Micro-Transfer-Printed Power Transistor Device dated Jul. 31, 2018 and filed May 16, 2017, discloses a compound power transistor device comprising a power transistor made in one material (e.g., GaN) disposed on a control circuit made in a different material (e.g., silicon). The disclosure teaches an embodiment in which two power transistors are made in a common substrate or two power transistors are made in separate substrates. In FIG. 3 of the disclosure, four separate power transistors are electrically connected in parallel. However, the resistive heating of such a transistor system can still limit the transistor system performance.

There is a need, therefore, for improved structures and methods of integration for large-current transistors and for reducing or managing the heat generated by large-current transistors.

SUMMARY

Embodiments of the present disclosure, among other things, comprise a multi-component transistor structure comprising components electrically connected in parallel, each of the components comprising one or more component transistors each having one or more transistor elements each having a respective transistor element resistance. One or more component connections each have a respective connection resistance, and each is electrically connected to respective transistor elements of the components. The connection resistance is less than, less than an average of, or less than a sum of the transistor element resistances of the respective transistor elements of each of the components and at least one component is disposed on, directly on, or over another component in a component stack. The components are functionally similar and provide the same function, even if the components differ in size or performance. In some embodiments of the present disclosure, the components are disposed directly on and in contact with or over a support substrate. Adjacent ones of the components can be separated by a distance that is less than a width of each of the adjacent components.

The component stack can be an aligned stack of components with aligned component edges or an offset stack of components with at least one component with an unaligned component edge. An offset component stack can expose at least a portion of the transistor element of a component and the component connection can be disposed at least partly along and in electrical contact with the exposed portion of the transistor element. In some embodiments, the component connection is disposed at least partly through component vias in the components in the component stack. The component connection in the component via can have a cross section aspect ratio greater than one taken in a plane parallel to a surface of the support substrate forming a wall that can provide electromagnetic interference protection to the component transistors.

In some embodiments, the components are disposed in a component stack comprising a first lower row (layer) and a second upper row (layer) comprising the same number of components as the first lower row disposed on the first lower row. In some embodiments, the components are disposed in in an offset component stack comprising a first lower row and a second upper row disposed on the first lower row comprising fewer components than the first lower row. In some embodiments, at least some of the components in an offset component stack have different sizes and are disposed in a component stack with at least one relatively smaller component disposed on at least one relatively larger component or at least one larger component disposed on multiple smaller components. At least one edge of a component on which another component is disposed can be exposed and a component connection can be electrically connected on the exposed edge to a transistor element. The component connection can be electrically connected to a transistor element along the exposed edge.

In some embodiments, a multi-component transistor structure comprises a component substrate comprising a component material. The support substrate comprises a support material. One or more of the components is disposed on or in the component substrate, and the component material can be different from the support material. The component substrate can be disposed directly on and in contact with or over the support substrate.

In some embodiments, a heat conductor is disposed on the support substrate that extends beneath one or more of the components.

In some embodiments, the components are substantially identical, are substantially identical in size, or are substantially identical in materials.

In some embodiments, each component comprises a separate, discrete, distinct, different, and individual component substrate. Some embodiments comprise a common component substrate, and some components are formed in or disposed directly on and in contact with the common component substrate.

The components can comprise a compound semiconductor substrate. Each of the components can be a chiplet or bare die (e.g., an unpackaged die without bond wires), groups of the components can be each a chiplet or bare die, or all of the components comprise a chiplet or bare die. Bare dies can have a thickness no greater than fifty microns, no greater than twenty microns, no greater than ten microns, or no greater than five microns.

In some embodiments, one or more of the components comprises a connection post electrically connected to a transistor element.

At least one of the components can comprise one or more transistor elements that are linear or serpentine. In some embodiments, for at least one of the components, at least one of the multiple transistor elements is interdigitated with another different one of the multiple transistor elements, e.g., forming sub-transistors.

Each of the components can comprise a fractured tether or the multi-component transistor structure can comprise a fractured tether.

In some embodiments, the connection resistance(s) is less than the transistor element resistance(s) of one or more, an average of, or a sum of the respective corresponding transistor element(s). A length of each of the component connection(s) can be less than a length of the transistor element in a component or a sum of the lengths of the respective corresponding transistor elements in each of the components. Each of the component connection(s) can have a lower resolution than a resolution of the components. Each of the component connection(s) can be external to the components or pass through the components.

In some embodiments of the present disclosure, each of the components is a transistor, the one or more transistor elements of the component transistor comprise a source, a gate, and a drain, and the one or more component connections comprise (i) a component source connection electrically connected to the source of each of the component transistors, (ii) a component gate connection electrically connected to the gate of each of the component transistors, and (iii) a component drain connection electrically connected to the drain of each of the component transistors. The respective connection resistance of the component source connection can be less than a sum of the respective transistor element resistances of the source of each of the component transistors, the respective connection resistance of the component gate connection can be less than a sum of each of the respective transistor element resistances of the gate of each of the component transistors, and the respective connection resistance of the component drain connection can be less than a sum of the respective transistor element resistances of the drain of each of the component transistors.

In some embodiments, (i) the component gate connection has a greater conductivity than a conductivity of the gate or gate electrode of any of the component transistors, (ii) the component source connection has a greater conductivity than a conductivity of the source or source electrode of any of the component transistors, or (iii) the component drain connection has a greater conductivity than a conductivity of the drain or drain electrode of any of the individual component transistors, or (iv) any combination of (i)-(iii).

According to some embodiments, at least two of the components in the multi-component transistor structure are mutually non-native. In some embodiments all of the components are mutually non-native. For example, the components can be printed to a destination substrate and/or onto each other.

In some embodiments, a multi-component transistor structure comprises a silicon support substrate comprising an electronic circuit that is electrically connected to any one or more of the component gate connection, the component source connection, and the component drain connection. The component transistors can be disposed directly on and in contact with or over the support substrate. In some embodiments, the component gate connection, the component source connection, and the component drain connection are respectively a first component gate connection, a first component source connection, and a first component drain connection and the multi-component transistor structure comprises a second component gate connection, a second component source connection, and a second component drain connection electrically connected to the gate, source, and drain, respectively. A material, material width, or material thickness of the component connection can be different from a material, material width, or material thickness of the respective transistor elements.

In some embodiments, a multi-component transistor structure comprises components electrically connected in parallel, each of the components comprising at least a transistor element having a length and a component connection electrically connected to the transistor element of each of the components. A length of the component connection is less than a sum of the lengths of the transistor elements of each of the components and at least one component is disposed on another component, for example in an offset component stack.

In some embodiments, a multi-component transistor structure comprises components electrically connected in parallel, each of the components comprising at least a transistor element having a transistor element resistance and a component connection electrically connected to the transistor element of each of the components and having a connection resistance. Each one of the multiple transistor elements in the components can be electrically connected in parallel with a different and separate component connection each having a connection resistance. The connection resistance is less than at least one of the transistor element resistances.

At least one component can be disposed on another component, for example in an offset or an aligned component stack. An integral of a connection resistance function taken over a length of the component connection is less than an integral of a transistor element resistance function taken over a sum of the lengths of the transistor elements, where the connection resistance function is $f(x)=C_{RX}$ where $C_R=$ (the connection resistance divided by a length of the component connection), and the transistor element resistance function is $f(x)=E_{RX}$ where $E_R=$(the transistor element resistance divided by a length of the transistor element).

In some embodiments, a multi-component transistor structure comprises a plurality of component transistors electrically connected in parallel, each component transistor comprising at least a gate having a gate resistance, a source having a source resistance, and a drain having a drain resistance. Each component transistor comprises a die comprising a separate and individual substrate, a component gate connection electrically connected to the gates of each of the component transistors, a component source connection electrically connected to the source of each of the component transistors, and a component drain connection electrically connected to the drain of each of the component transistors. At least one component is disposed on another component, for example in an offset or aligned component stack. In embodiments, (a) a resistance of the component source connection is less than, less than an average of, or less than a sum of the source resistances of the component transistors, a resistance of the component drain connection is less than, less than an average of, or less than a sum of the drain resistances of the component transistors, a resistance of the component gate connection is less than, less than an average of, or less than a sum of the gate resistances of the component transistors, or any one or combination thereof, (b) the length of the component source connection is less than, less than an average of, or less than a sum of the lengths of the component sources, the length of the component gate connection is less than, less than an average of, or less than a sum of the lengths of the component gates, the length of the component drain connection is less than, less than an average of, or less than a sum of the lengths of the component drains, or any one or combination thereof, or (c) wherein
  (i) an integral of a source connection resistance function taken over a length of the component source connection is less than an integral of a source resistance function taken over a sum of the lengths of the sources, the source connection resistance function is $f(x)=C_R x$ where $C_R=$(a resistance of the component source connection divided by a length of the component source connection), and the source resistance function is $f(x)=E_R x$ where $E_R=$(source resistance divided by a length of the source),
  (ii) an integral of a gate connection resistance function taken over a length of the component gate connection is less than an integral of a gate resistance function taken over a sum of the lengths of the gates, the gate connection resistance function is $f(x)=C_R x$ where $C_R=$(a resistance of the component gate connection divided by a length of the component gate connection), and the gate resistance function is $f(x)=E_R x$ where $E_R=$(gate resistance divided by a length of the gate), or
  (iii) an integral of a drain connection resistance function taken over a length of the component drain connection is less than an integral of a drain resistance function taken over a sum of the lengths of the drains, the drain connection resistance function is $f(x)=C_R x$ where $C_R=$(a resistance of the component drain connection divided by a length of the component drain connection), and the drain resistance function is $f(x)=E_R x$ where $E_R=$(drain resistance divided by a length of the drain),
  (iv) or any one or combination of (i), (ii), and (iii),
(d) or any one or combination of (a), (b), and (c).

According to some embodiments of the present disclosure, any one or combination of a material, material width, or material thickness of the component source connection is different from a material, material width, or material thickness of the source, a material, material width, or material thickness of the component gate connection is different from a material, material width, or material thickness of the gate, and a material, material width, or material thickness of the component drain connection is different from a material, material width, or material thickness of the drain.

Component transistors of the present disclosure can be power transistors, for example power field effect transistors (FETs) or radio frequency (RF) transistors and can be made in a compound semiconductor material, for example a III/V compound semiconductor such as GaAs, GaN, or InP or a II/VI compound semiconductor.

In some embodiments, one or more electrically conductive connection posts protrude from a side of the transistor substrate and are electrically connected to the component transistor. One or more electrical contact pads can be disposed on a support substrate and each transistor connection post can be electrically connected to a contact pad. Likewise, an electronic circuit can be formed in or on the support substrate and the one or more electrically conductive connection posts can be electrically connected to the electronic circuit through the contact pads. The electronic circuit disposed in the support substrate can be, for example and not limited to, an integrated circuit, an active electronic circuit, a control circuit, or a CMOS electronic circuit. In some embodiments, the support substrate comprises silicon and the transistor substrate comprises a different transistor material, for example a compound semiconductor, a III-V semiconductor, or a GaAs semiconductor.

According to some embodiments of the present disclosure, a semiconductor structure comprises a semiconductor substrate (e.g., a component substrate) having a first side and a second side, the second side on an opposite side of the semiconductor substrate from the first side, and a high-aspect-ratio via (e.g., a component via) formed in the semiconductor substrate that extends from the first side to the second side through the semiconductor substrate. The high-aspect-ratio via can have a high aspect ratio in a cross section of the high-aspect-ratio via parallel to the first side. The high-aspect-ratio via can comprise a dielectric surrounding a via conductor that can be a component connection. Some embodiments comprise a circuit (e.g., a component transistor) formed in or on the first side of the semiconductor substrate and the via conductor can be electrically connected to the circuit. The high-aspect-ratio via can extend at least along a side of the circuit, for example no less than halfway along a side of the circuit, no less than halfway along two sides of the circuit, no less than halfway along three sides of the circuit, or no less than halfway along four sides of the circuit. In some embodiments, the high-aspect ratio via can extend three quarters or all of the way along a side of the circuit. Some embodiments comprise a plurality of separate high-aspect-ratio vias in one semiconductor substrate that can be disposed along one or more sides of the circuit, that are not in contact with each other, and can extend completely along each side of the circuit. Some embodiments comprise a plurality of separate semiconductor substrates disposed in a component stack, each of the semiconductor substrates comprising a via conductor, and the via conductors of the separate semiconductor substrates are electrically connected. The via conductors can be vertically aligned in a direction orthogonal to the first side. The via conductors can extend between at least two semiconductor substrates beyond the high-aspect-ratio via.

The present disclosure provides advantages over transistor assemblies of the prior art, in particular for power transistors or those components whose performance can be limited by resistive heating. According to embodiments of the present disclosure, a plurality of smaller high-performance components (such as transistors) is connected in parallel to reduce resistive heating, spatially distribute unwanted heat generation, and improve electrical operating efficiency. Such a disaggregation of a single large component into multiple smaller components electrically connected in parallel reduces resistive losses, thereby distributing electrical current more evenly and reducing maximum current density. Furthermore, by micro-transfer printing the component transistors, made in a semiconductor material optimized for transistors such as a compound semiconductor, onto a substrate of different semiconductor material, for example a silicon semiconductor optimized for control logic or integrated circuits, an integrated structure with materials chosen to optimize different tasks is provided. Embodiments of the present disclosure therefore enable an improved transistor structure. By micro-transfer printing multiple component transistors onto a substrate having logic or control circuits, manufacturing cycle time and costs are reduced, and higher performance enabled in a more highly integrated device with a smaller size.

BRIEF DESCRIPTION OF THE DRAWINGS

The foregoing and other objects, aspects, features, and advantages of the present disclosure will become more apparent and better understood by referring to the following description taken in conjunction with the accompanying drawings, in which:

FIG. 1A is a simplified perspective of an offset component stack, FIG. 1B is a cross section, and FIG. 1C is a partial cross section taken along cross section line A of FIG. 1A illustrating some embodiments of the present disclosure;

FIG. 1D is a cross section illustrating larger components on smaller components in an offset stack according to embodiments of the present disclosure;

FIG. 2A is a simplified perspective of an aligned component stack, FIG. 2B is a cross section with a detail taken along cross section line A of FIG. 2A, FIG. 2C is a partial cross section taken along cross section line A of FIG. 2A, and FIG. 2D is a plan view of a component illustrating some embodiments of the present disclosure;

FIG. 3A is a plan view, FIG. 3B is a perspective, and FIG. 3C is a cross section with a detail taken along cross section line A of FIGS. 3A and 3C illustrating some embodiments of the present disclosure;

FIG. 3D is a perspective and FIG. 3E is a cross section with a detail taken along cross section line A of FIG. 3D illustrating some embodiments of the present disclosure;

FIG. 4A is a simplified schematic representation of a component connection and FIG. 4B is an electrically equivalent conductor corresponding to FIG. 4A useful in understanding embodiments of the present disclosure;

FIG. 5A is a plan view of a single serpentine transistor, FIG. 5B is a plan view of a single interdigitated transistor.

FIGS. 7A and 7B are cross sections illustrating stacked embodiments of the present disclosure;

FIGS. 8A-8C are cross sections illustrating offset stacked embodiments of the present disclosure;

FIGS. 10A and 10B are cross sections of a component source wafer and components according to illustrative embodiments of the present disclosure;

Figure 5C:
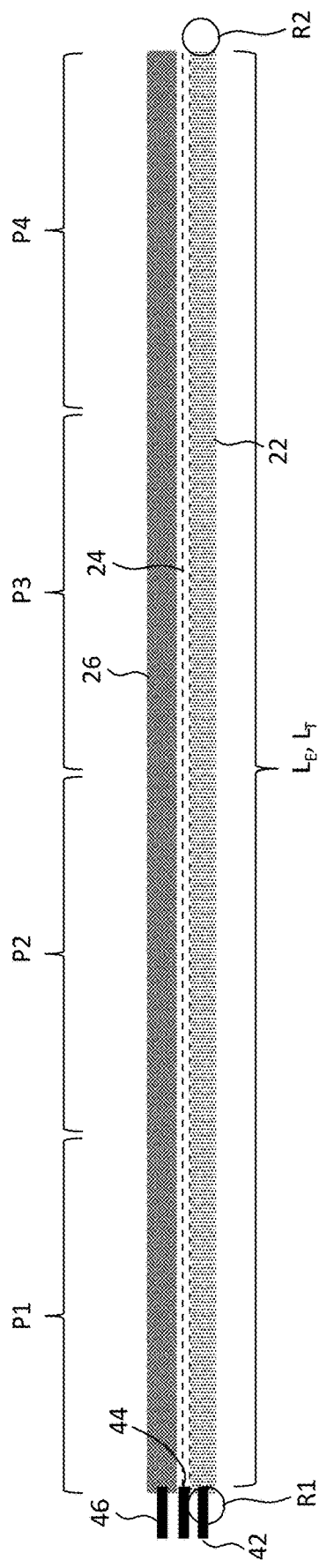
FIG. 5C is an electrically equivalent non-serpentine transistor corresponding to FIGS. 5A and 5B useful in understanding embodiments of the present disclosure.

The features and advantages of the present disclosure will become more apparent from the detailed description set forth below when taken in conjunction with the drawings, in which like reference characters identify corresponding elements throughout. In the drawings, like reference numbers generally indicate identical, functionally similar, and/or structurally similar elements. The figures are not drawn to scale since the variation in size of various elements in the Figures is too great to permit depiction to scale.

DETAILED DESCRIPTION OF CERTAIN EMBODIMENTS

Embodiments of the present disclosure provide, among other things, a disaggregated multi-component transistor structure comprising one or more stacks of components electrically connected in parallel with component connections. Stacks of parallel-connected components can have a performance superior to a single larger component providing the same function and having the same structure and size. In some embodiments, the components are integrated circuits comprising transistors. In some embodiments, the components are micro-assemblies comprising a component substrate, bare die (e.g., unpackaged integrated circuits comprising one or more transistors), and electrical connections. Each transistor can comprise a gate controlling current flow through an interface (shown as a gate in the figures) between a source and drain. The interfaces of all of the transistors, taken together, can have an aggregated area or length equivalent to an interface area or length of a single, larger transistor, thus providing the same function and having substantially the same total structure and size. The disaggregated multiple components and component connections can have reduced resistive heating and improved conductivity and therefore can be more efficient and can operate at higher power levels and switching speeds than the single, larger transistor. The multiple components can each be a power transistor. To enable shorter component connections and reduced resistance in the parallel electrical connection connecting the components, the components can be provided in a stacked configuration of bare die with at least one component disposed on another component in a component stack, for example disposed on a support substrate.

According to embodiments of the present disclosure and as shown in FIGS. 1A-1C and FIGS. 2A-2D, a multi-component transistor structure 99 comprises separate and discrete components 20 each comprising a component transistor 21 comprising a transistor element 40 and a component connection 30 disposed external to transistor element 40 of each of components 20 on a support substrate 10. Component connection 30 is not a part of component transistor 21 and is not a transistor element 40. In some embodiments, at least some of component connection 30 is not physically in and is external to components 20. In some embodiments, component connection 30 can be at least partially disposed within component 20 and can connect to transistor element 40. In some embodiments, component connection 30 passes through components 20. Each component 20 comprises a component transistor 21 comprising a transistor element 40 having a transistor element resistance and an individual, discrete, and separate component substrate 56. Component transistor 21 can be native to component substrate 56. Component substrate 56 can be a semiconductor substrate, for example a compound semiconductor substrate. Component connection 30 has a connection resistance and electrically connects transistor elements 40 in each of components 20 in parallel. The connection resistance can be less than the transistor element resistance of the corresponding transistor element 40 of at least one component transistor 21 of at least one of components 20, the component transistors 21 are functionally similar, and at least one of components 20 is disposed on another different one of components 20 in a component stack 28. Components 20 can comprise a dielectric or passivation layer disposed on a side of components 20 opposite component substrate 56 to provide electrical insulation and enable component stacking without electrical shorting. The components 20 are separate and distinct from each other. Functionally similar component transistors 21 have the same transistor 40 elements and perform the same function in an electronic circuit but may differ in size or shape or materials.

In some embodiments, the connection resistance is less than a sum of the transistor element resistances of components 20. In some embodiments, the connection resistance is less than an average of the transistor element resistances of components 20. In some embodiments, the connection resistance is less than at least one of the transistor element resistances (e.g., all of the transistor element resistances) of components 20. In some embodiments, a resistivity (e.g., resistance per length or ohms per square) of connection resistance is less than a resistivity of the transistor element resistances of components 20. In some embodiments, a length of component connection 30 (component connection length $L_C$ as shown in FIGS. 3A, 4A, and 4B) is less than a length of at least one transistor element 40 (transistor element length $L_E$ as shown in FIGS. 3A and 5C). In some embodiments, a length $L_C$ of component connection 30 is less than an average or a sum of the lengths $L_E$ of transistor elements 40 of components 20. In some embodiments, component connection length $L_C$ is longer than transistor element length $L_E$) but has a lower resistance because component connection 30 comprises anyone or more of different materials, wider wires, or thicker wires. In general, for each process resolution there is an optimal transistor element length $L_E$ that minimizes the drain-source resistance (RDSON), e.g., the lateral scaling limit. However, switching frequency requirements can also affect the desired transistor element length $L_E$, so that the actual choice of transistor element length $L_E$) and component connection length $L_C$ is a matter of design for a specific implementation.

In some embodiments and as shown in FIGS. 1B and 2B, each component transistor 21 can have multiple transistor elements 40, for example a source 22 (e.g., an n- or p-doped semiconductor portion of component substrate 56), a drain 26 (e.g., a p- or n-doped semiconductor portion of component substrate 56), and a gate 24 (e.g., that can be an interface (illustrated as a rectangle for clarity) between source 22 and drain 26) (each referred to as a transistor element 40 and collectively transistor elements 40). Each transistor element 40 can be electrically connected with and comprise a transistor electrode 41, for example a source electrode 42, a gate electrode 44, or a drain electrode 46 (collectively transistor electrodes 41) that is in contact with the semiconductor portion of component substrate 56 and that can each comprise a portion of transistor element 40. Thus, the transistor element resistance of transistor element 40 can include the resistance of transistor electrode 41 and the resistance of a corresponding semiconductor portion in contact with transistor electrode 41. Transistor electrodes 41 can each be connected to a separate, discrete, and individual component connection 30, for example so that sources 22 of component transistors 21 of components 20 are electrically connected in parallel and in common with a component source connection 32, the gates 24 of component transistors 21 of components 20 are electrically connected in parallel and in common with a component gate connection 34, and the drains 26 of component transistors 21 of components 20 are electrically connected in parallel and in common with a component drain connection 36. Component source, gate, and drain connections 32, 34, 36 are generically referred to as component connections 30.

Each component 20 can have a separate, discrete, and individual component substrate 56, for example micro-transfer printed from a component source wafer onto support substrate 10 or onto other components 20 or layers (e.g., encapsulation or planarization layers 70 such as dielectric structures 58) disposed on and insulating components 20 from electrical conductors such as component connections 30 or stacked component substrates 56. As a consequence of micro-transfer printing, each component 20 can comprise a fractured component tether 52. Each component 20 can be a singular, separate, distinct, and different unpackaged die 98. The dies 98 can have a small thickness, for example from 2 to 20 microns, thereby enabling a dense configuration, efficient components 20 stacking, and short, low-resistance component connections 30 between components 20 in component stack 28. Component transistor 21 can be a power transistor.

As shown in FIG. 1A, according to some embodiments of the present disclosure, components 20 can have different sizes and are disposed in component stack 28 on support substrate 10 according to size with the largest component 20 disposed directly on or over support substrate 10 and successively smaller components 20 stacked in size order on or over the largest component 20 (e.g., in a direction orthogonal to a surface of support substrate 10 on which components 20 are disposed), so that the smallest component 20 is disposed farthest from support substrate 10. Component stack 28 can be two components 20 high, three components 20 high, or four (or more) components 20 high. As shown in FIG. 1B, some layers of component stack 28 comprise more than one component 20. Each layer of component stack 28 can comprise the same number of components 20 (e.g., as shown in FIG. 2B for an aligned component stack 28, though some embodiments are unaligned) or have different numbers of components 20 (e.g., as shown in FIG. 1B). In some embodiments, each successive layer of component stack 28 has a smaller number of components 20 forming an offset component stack 28 with a tiered structure so that the lowest layer has the largest number of components 20 and the top layer has the smallest number of components 20, as shown in FIG. 1B. The top layer can be a side of component stack 28 opposite support substrate 10. Component stacks 28 of components 20 can enable a greater density of components 20 with shorter component connections 30.

Components 20 in component stack 28 can be spatially offset with respect to one component edge, two component edges, three component edges, or four component edges (e.g., as shown in FIG. 1A in a wedding cake configuration) and hence can be aligned on three component edges, two component edges, one component edge, or no component edges, respectively. In some embodiments, as shown in FIG. 1A, first component 20A is disposed on support substrate 10, second component 20B smaller than first component 20A is disposed on first component 20A, and third component 20C smaller than second component 20B is disposed on second component 20B. FIG. 1A illustrates a single first component 20A, a single second component 20B, and a single third component 20C, wherein the first, second, and third components 20A, 20B, 20C have different sizes. In some embodiments, as shown in FIG. 1B, component stack 28 comprises multiple first components 20A disposed in a first layer (a first row) on support substrate 10, multiple second components 20B disposed in a second layer (a second row) on the first layer of first components 20A, and a third component 20C disposed in a third layer on the second layer of second components 20B. The first, second, and third layers of components 20 are spatially offset and thus components 20 are likewise offset. The first, second, and third components 20A, 20B, 20C can have the same size, as shown in FIG. 1B, or can be different sizes, as in FIG. 1A. FIG. 1C shows an edge of spatially offset component stack 28 of transistor elements 40 and transistor electrodes 41 electrically connected with component connection 30 and insulated with dielectric structures 58. Offset component stack 28 can expose at least a portion of transistor element 40 on an edge of each of components 20 and component connection 30 can be disposed at least partly along and in electrical contact with the exposed portion of transistor element 40.

In some embodiments, as shown in FIGS. 1A-1D, all of components 20 are disposed in component stack 28, component stack 28 is an offset component stack 28, and component connection 30 is disposed at least partly on an edge or exposed portion of components 20. An offset component stack 28 can comprise one or more components 20 disposed in at least a first lower row of components 20 and a second upper row of one or more components 20 disposed on or over the first lower row of components 20. In some embodiments, in an offset component stack 28, either the second upper row comprises fewer components 20 than the first lower row or at least some components 20 in the second upper row are smaller than components 20 in the first lower row, for example exposing an edge of components 20 in the first row, or there are fewer components 20 that are also smaller. In some embodiments, one or more larger components 20 in one layer are disposed on multiple smaller components 20 in another layer, as shown in FIG. 1D.

According to some embodiments, and as shown in FIGS. 2A-2D, all of components 20 are not offset and are aligned with vertical edges, e.g., orthogonally with respect to a surface of support substrate 10 on which components 20 are disposed. In some embodiments, not shown in the Figures, components 20 are aligned on some edges and offset on other edges. As shown in FIGS. 2A-2C, first, second, and third components 20A, 20B, and 20C are disposed in an aligned component stack 28. In some embodiments, multi-component transistor structure 99 comprises multiple aligned and adjacent component stacks 28 that share a common component connection 30, for example as shown in FIG. 2B.

In some embodiments, as shown in FIG. 2C, components 20 are electrically connected with component connection 30 through component vias 54. Since photolithographically constructed component transistors 21 are largely planar and components 20 according to embodiments of the present disclosure can have a relatively small component substrate 56 thickness, component connections 30 for a component stack 28 of components 20 that pass through or on the edge of component substrates 56 can be relatively short (and therefore a lower resistance and greater efficiency) compared to electrical connections disposed on support substrate 10 for components 20 that are not in a component stack 28.

Component vias 54 can have a cross section aspect ratio taken in a plane parallel to a surface of support substrate 10 that is 1:1 (length to width). In some embodiments, and as shown in FIG. 2D, the cross section aspect ratio of component vias 54 can be greater than one, for example two, four, eight, ten, or even more so that component connection 30 forms a wall through component 20 (through a portion of component substrate 56). In some embodiments, for example, component vias 54 can have a size of about (e.g., within 10% of) or no more than 10 microns by 50, 100, 200, or 500 microns and a corresponding aspect ratio of about (e.g., within 10% of) or no more than 5, 10, 20, or 50. Such a high-aspect ratio component connection 30 can provide increased electrical conductivity and thermal conductivity and can also serve as an electromagnetic radiation shield that reduces electromagnetic interference between components 20. Component vias 54 can be disposed in a center of components 20 or closer to a center of components 20 than to an edge of components 20 to facilitate routing of electrical connections between components 20. In some embodiments, multiple component vias 54 are connected in parallel between components 20.

Thus, according to some embodiments of the present disclosure, a semiconductor structure comprises a semiconductor substrate (e.g., component substrate 56) having a first side and a second side, the second side on an opposite side of the semiconductor substrate from the first side, and a high-aspect-ratio via (e.g., component via 54) formed in the semiconductor substrate that extends from the first side to the second side through the semiconductor substrate. The high-aspect-ratio via can have a high aspect ratio in a cross section of the high-aspect-ratio via parallel to the first side. The high-aspect-ratio via can comprise a dielectric surrounding a via conductor that can be a component connection 30. Some embodiments comprise a circuit (e.g., component transistor 21) formed in or on the first side of the semiconductor substrate and the via conductor can be electrically connected to the circuit. The high-aspect-ratio via can extend at least along a side of the circuit, for example no less than one half, one quarter, one eighth, or one sixteenth of the way along a side of the circuit, no less than one half, one quarter, one eighth, or one sixteenth of the way along two sides of the circuit, no less than one half, one quarter, one eighth, or one sixteenth of the way along three sides of the circuit, or no less than one half, one quarter, one eighth, or one sixteenth of the way along four sides of the circuit.

In some embodiments, the high-aspect ratio via can extend three quarters or all of the way along a side of the circuit. Some embodiments comprise a plurality of separate high-aspect-ratio vias in one semiconductor substrate that can be disposed along one or more sides of the circuit, that are not in contact with each other, and can extend completely along each side of the circuit. Some embodiments comprise a plurality of separate semiconductor substrates disposed in a component stack 28, each of the semiconductor substrates comprising a via conductor, and the via conductors of the separate semiconductor substrates are electrically connected. The via conductors can be vertically aligned in a direction orthogonal to the first side. The via conductors can extend between at least two semiconductor substrates beyond the high-aspect-ratio via and can provide additional shielding.

Each component 20 can comprise a transistor element 40 having a transistor element resistance, for example, but not necessarily, an ohmic resistance to the conduction of electrical current. Transistor element 40 can be a conductor, for example a wire or conductive area, for example comprising patterned metal, metal particles, or conductive polymers or conductive oxides, such as transparent conductive oxides, including ITO. Transistor element 40 can be a semiconductor, for example a doped semiconductor, such as a p-doped semiconductor or an n-doped semiconductor. Transistor element 40 can be a semiconductor in combination with a conductor disposed in electrical contact with the semiconductor. Transistor element 40 has a transistor element resistance, that is an electrical resistance to a flow of current (e.g., electrons or holes) along the extent of transistor element 40.

Components 20 can comprise a bulk layer of a semiconductor (for example a compound semiconductor such as GaAs, GaN, InP or various binary, trinary, or quaternary compound semiconductors) comprising component substrate 56 and a doped or implanted portion of the bulk layer forming component transistor 21 and transistor elements 40. (For clarity, in the Figures the bulk semiconductor comprising component substrate 56 is shown as thinner or smaller than transistor elements 40, but in practice can be much thicker or larger than transistor elements 40.) Transistor electrodes 41 can be metal or semiconductor materials (e.g., doped semiconductor materials) or combinations thereof in transistor element 40 for conducting electrical current to source, gate, or drain 22, 24, 26. Gate 24 can be a gate electrode 44 (e.g., a transistor electrode 41). Components 20, component transistors 21, transistor elements 40, transistor electrodes 41, and component connection 30 can be constructed using photolithographic methods and materials.

In some embodiments, a thickness or width of component connection 30 is greater than a thickness or width of transistor elements 40 or transistor electrodes 41 of component transistor 21 of components 20. Component connection 30 can comprise different materials than transistor elements 40 or transistor electrodes 41 of component transistor 21 of components 20. In some embodiments, component connection 30 has a lower resolution than a resolution of transistor element 40 and can be made in a different process or with different process limitations, for example transistor element 40 can have a finer resolution with smaller features or feature separation than component connection 30.

Component connections 30 are electrically connected to respective transistor elements 40 of each component 20 in parallel. Thus, if component 20 comprises first, second, and third transistor elements 40 (e.g., source, gate, and drain 22, 24, 26), a first component connection 30 is electrically connected in parallel to first transistor element 40 of all of components 20 in multi-component transistor structure 99 so that first component connection 30 is electrically connected in parallel to every first transistor element 40 in multi-component transistor structure 99, a second component connection 30 is electrically connected in parallel to second transistor element 40 of all of components 20 in multi-component transistor structure 99 so that second component connection 30 is electrically connected in parallel to every second transistor element 40 in multi-component transistor structure 99, and a third component connection 30 is electrically connected in parallel to third transistor element 40 of all of components 20 in multi-component transistor structure 99 so that third component connection 30 is electrically connected in parallel to every third transistor element 40 in multi-component transistor structure 99. First, second, and third component connections 30 are separate and distinct electrical conductors.

In some embodiments, a respective connection resistance of each component connection 30 (e.g., the resistance of component connection 30) is less than the corresponding transistor element resistance of at least one component transistor 21, less than an average of the corresponding transistor element resistances of component transistor 21 of components 20, or less than a sum of the corresponding transistor element resistances of component transistor 21 of each of components 20. A resistivity of the component connection 30 can be less than a resistivity of the transistor element 40 of components 20. Resistivity can be a resistance per length or ohms per square of connection resistance and transistor element resistance. Thus, using the example above, the connection resistance of first component connection 30 can be less than, less than an average of, or less than a sum of the transistor element resistances of first transistor elements 40 of all of components 20 connected by first component connection 30, the connection resistance of second component connection 30 can be less than, less than an average of, or less than of a sum of the transistor element resistances of second transistor elements 40 of all of the components 20 connected by second component connection 30, and the connection resistance of third component connection 30 can be less than, less than an average of, or less than a sum of the transistor element resistances of third transistor elements 40 of all of the components 20 connected by third component connection 30.

A material, material thickness, or material width of component connection 30 can be different from a material or material thickness of transistor element 40. In some embodiments, the material of component connection 30 is more conductive (e.g., has a greater conductivity) than a material of respective transistor element 40 to which component connection 30 is electrically connected. In some embodiments, a material thickness of component connection 30 is greater than a material thickness of transistor element 40 to which component connection 30 is electrically connected. In some embodiments, a material width of component connection 30 is greater than a material width of transistor element 40 to which component connection 30 is electrically connected. Thus, in some embodiments, component connections 30 are more conductive than transistor elements 40, e.g., have a lower resistivity per length or ohms per square.

Component connection 30 has a connection resistance, for example but not necessarily, an ohmic resistance that is an electrical resistance to a flow of current (e.g., electrons or holes). Component connection 30 includes only those portions of a conductor that electrically connect transistor elements 40 of components 20 in common (e.g., see conductor 80 in FIG. 16 for portions of a conductor that are not included in component connection 30) and the connection resistance is the resistance to current flow through all of the necessary portions. For example, component connection 30 can be electrically connected to an external controller or external circuit (not shown), but those portions of conductor 80 electrically connected to the external controller are not necessary to electrically connect transistor elements 40 of components 20 in common and are therefore not portions of component connection 30. Similarly, the transistor element resistance is the resistance to current flow through the entire transistor element 40. According to some embodiments of the present disclosure, the connection resistance of component connection 30 is less than, less than the average, or less than the sum of the transistor element resistances of elements 40 of each of the components 20. Where one or both of the element or common transistor element resistances vary as a function of operation, the element or common resistances are measured under the same operating conditions.

In some embodiments of the present disclosure, a length of component connection 30 is less than a length of the transistor element 40 in a component 20, is less than an average of the lengths of the respective corresponding transistor elements 40 in the components 20, or is less than a sum of the lengths of the respective corresponding transistor elements 40 in the components 20, e.g., the corresponding transistor elements 40 in the components 20 to which the component connection 30 is connected.

FIGS. 3A-3E illustrate embodiments of a multi-component transistor structure 99 comprising components 20 in a row or layer on support substrate 10 and electrically connected in parallel with component connections 30, e.g., corresponding to a layer or row in FIG. 1B. Each component 20 comprises one or more transistor elements 40 each having a respective transistor element resistance. Thus, each transistor element 40 of a component 20 has a transistor element resistance. The transistor element resistance is the resistance of the entire transistor element 40, for example the sum of the resistances of all of any portions of transistor element 40. A substantially linear transistor element 40 can have a transistor element resistance per length (e.g., ohms per square) that, when multiplied by the linear transistor element 40 length, can substantially equal the transistor element resistance.

FIG. 3A is a plan view of a multi-component transistor structure 99 comprising multiple component connections 30 electrically connecting transistor elements 40 of component transistors 21 in components 20 comprising component transistors 21 disposed in a row or layer. (FIGS. 3A-3E show only one row or layer of components 20 but some embodiments of the present disclosure include multiple rows or layers in a component stack 28, for example as shown in FIGS. 1A-2C.) As shown in FIGS. 3B and 3C, each component 20 has or comprises a separate, discrete, distinct, different, and individual component substrate 56 (e.g., has or comprises a separate, discrete, distinct, different, and individual die 98) and some components 20 can be formed in or disposed on (e.g., directly on and in contact with) or over a support substrate 10 or layers disposed on support substrate 10.

As shown in FIGS. 3D and 3E, in some embodiments components 20 share a common component substrate 57 and components 20 can be disposed directly on and in contact with common component substrate 57 or can be constructed on or in (e.g., native to) common component substrate 57. According to some embodiments of the present disclosure, components 20 that share a common component substrate 57 are or comprise a single, unpackaged bare die 98, chiplet, or micro-chiplet, and can be a micro-transfer-printable or -printed unit, structure, or device, for example micro-transfer printed with a single post of a transfer-print stamp and are therefore not native to common component substrate 57. Thus, a single unpackaged bare die 98, chiplet, unit, or device can comprise a single component 20 (as shown in FIGS. 3A-3C) or can comprise a group of components 20 (as shown in FIGS. 3D-3E). Each die 98, if micro-transfer printed, can comprise a broken (e.g., fractured) or separated component tether 52 or, if disposed on a component source wafer 60 (a component source substrate), can comprise a component tether 62 (see FIGS. 10A, 10B discussed below) that is not broken (e.g., fractured) or separated.

A multi-component structure 99 can comprise a plurality of component 20 groups sharing a common component substrate 57 and interconnected with component connections 30 (e.g., as shown in FIGS. 3D and 3E). Some such embodiments can provide improved component 20 packing density. Portions or all of component connection 30 disposed on common component substrate 57 can be constructed with relatively fine (high-resolution) processes (e.g., made using front-end-of-line processes), improving packing density, and portions of component connections 30 providing electrical connections between groups of components 20 sharing a common component substrate 57 can be made at relatively coarse (low-resolution) processes (e.g., back-end-of-line processes) with wider, thicker or wider and thicker lines to improve electrical conductivity and reduce thermal resistance. In some designs it can be preferable to make the high-resolution portions of component connections 30 relatively shorter and the low-resolution portions relatively longer to reduce the overall resistance and parasitic capacitance and parasitic inductance of the component connections 30. If desired, component substrates 57 can be spaced farther apart than components 20 sharing common component substrate 57. In some designs, using unpackaged die microassembled using micro-transfer printing provides twice the component source wafer 60 utilization (reducing costs by one half) and using multiple common component substrates 57 can reduce costs by a factor of 22. Furthermore, component 20 groups sharing a common component substrate 57 can be tested before micro-assembly to ensure known good die thereby increasing yields.

FIGS. 3A-3E illustrate a multi-component transistor structure 99 according to embodiments of the present disclosure in which each component 20 comprises multiple transistor elements 40 each with its own transistor element resistance. Each transistor element 40 in a component 20 can have a different transistor element resistance, or some or all of the transistor element resistances can be the same. As illustrated in FIGS. 3A-3E, in some embodiments, component 20 is a component transistor 21, and each component transistor 21 has multiple transistor elements 40, for example a component transistor 21 can comprise a transistor element 40 that is a source 22 having a source resistance, a transistor element 40 that is a gate 24 having a gate resistance, and a transistor element 40 that is a drain 26 having a drain resistance. The sources 22 of each component 20 in multi-component transistor structure 99 are electrically connected with a component connection 30 that is a component source connection 32, the gates 24 of each component 20 in multi-component transistor structure 99 are electrically connected with a component connection 30 that is a component gate connection 34 (shown with a dashed connection in FIG. 3A and not shown in FIG. 3B), and the drains 26 of each component 20 in multi-component transistor structure 99 are electrically connected with a component connection 30 that is a component drain connection 36 (not shown in FIG. 3B). All of component connections 30 (e.g., component source connection 32, component gate connection 34, and component drain connection 36) are shown in FIG. 3A, only the component source connection 32 is shown in FIGS. 3B and 3D, and the component connections 30 are all omitted for clarity in FIGS. 3C and 3E.

FIG. 3A is a plan view that illustrates a multi-component transistor structure 99 that has four components 20, each a component transistor 21 with three transistor elements 40 (source 22, gate 24, and drain 26) of each component transistor 21 electrically connected in common with a component connection 30 (where component connection 30 refers generically to each of component source connection 32, component gate connection 34, and component drain connection 36). Each of source 22, gate 24, and drain 26 (transistor elements 40) (for a given component 20) have a length $L_E$. Components 20 (e.g., component transistors 21) are disposed on a support substrate 10, have a width W, and adjacent components 20 are separated on support substrate 10 by a separation S distance that can be less than width W, providing a dense arrangement of components 20 on support substrate 10 enabled by bare die 98 components 20. Component connections 30 can be likewise disposed on support substrate 10 and each have a component connection length $L_C$ (as discussed further below with respect to FIGS. 4A and 4B). FIGS. 3B and 3D are perspectives illustrating components 20 (e.g., component transistors 21) disposed on support substrate 10 and component source connection 32. FIGS. 3C and 3E are cross sections taken along cross-section line A of FIGS. 3A, 3B, and 3D and shows each of the four individual components 20 (e.g., component transistors 21) disposed on support substrate 10. In FIGS. 3A-3E, stacked components 20 are omitted for clarity.

According to some embodiments of the present disclosure, a connection resistance of component connection 30 is less than, less than the average of, or less than the sum of the transistor element resistances of the same transistor elements 40 of components 20 (e.g., taken from connection points R1 to R2 in FIG. 3A). Where components 20 have multiple transistor elements 40, the combined transistor element resistances are of corresponding transistor elements 40. As shown in FIG. 4A, in some embodiments, component connection 30 (e.g., corresponding to any of the component source, gate, or drain connections 32, 34, 36) comprises five portions, P1, P2, P3, P4, and P5. As shown in FIG. 4B, the connection resistance is the resistance of all five portions P1, P2, P3, P4, and P5 serially connected together, that is from connection points R1 to R2 in FIG. 4B (different from connection points R1 and R2 in FIG. 3A). The combined length of the five portions, P1, P2, P3, P4, and P5 is $L_C$, the length of component connection 30. Similarly, the length $L_E$ of transistor element 40 is the sum of all portions of transistor element 40 and the transistor element resistance is the resistance of all transistor element 40 portions electrically connected in serial. In embodiments in accordance with FIG. 3A, transistor element 40 is linear between connection points R1 and R2 but in some embodiments, for example as shown in FIG. 5A, transistor element 40 can be serpentine, comprise multiple segments, or comprise curves. Thus, according to some embodiments of the present disclosure and as illustrated in FIGS. 3A-3E, 4A, and 4B, the connection resistance is less than, less than the average of, or less than the sum of the transistor element resistances of corresponding transistor elements 40. In the FIGS. 3A-4B example, the sum of the transistor element resistances of corresponding transistor elements 40 is equal to four times the transistor element resistance of the length $L_E$ from connection points R1 to R2 (in FIG. 3A) of transistor element 40. (In this illustration, component connection 30 can be any one of component source connection 32, component gate connection 34, or component drain connection 36 and transistor element 40 can be the corresponding source 22, gate 24, or drain 26.)

According to some embodiments of the present disclosure, component connection 30 comprises a different material or has a different material thickness than transistor element 40. For example, transistor element 40 can be or include a doped semiconductor or an aluminum conductor. As an example, component connection 30 can be copper. For example, transistor element 40 can have a thickness less than two microns and component connection 30 can have a thickness greater than two microns.

As shown in FIG. 5A, a transistor can be serpentine, for example a source, gate, or drain 22, 24, 26 of a serpentine transistor 90 each with a connected source, gate, or drain electrode 42, 44, 46, respectively, provided, for example, in a die 98. As shown in FIG. 5B, an interdigitated transistor 92 can comprise interdigitated sub-transistors electrically connected in parallel, each having a source, gate, or drain 22, 24, 26 each with a connected source, gate, or drain electrode 42, 44, 46, respectively, provided, for example, in a die 98. (Drain electrode 46 is not shown in FIG. 5B but electrically connects each of the drains 26, for example through vias or in a different interconnect or metal layer). FIG. 5C illustrates an electrically equivalent linear transistor for serpentine transistor 90 in FIG. 5A or each interdigitated sub-transistor of interdigitated transistor 92 in FIG. 5B. The transistor element resistance is the resistance of the transistor element 40 along the length of transistor element 40 (transistor length $L_T$) forming at least a portion of component 20, for example from connection points R1 to R2, and, in these examples, at least a portion of component transistor 21. For illustration as shown in FIG. 5C and corresponding to the illustration of FIGS. 3A-4B, transistor element 40 of component transistor 21 is divided into four (arbitrarily selected) serially connected portions P1-P4 comprising transistor length $L_T$. In some embodiments of the present disclosure, each of the four portions P1-P4 is provided as a component 20 having a transistor element 40 (any one of source 22, gate 24, or drain 26) as shown in FIGS. 3A-3C and electrically connected with a component connection 30. As shown in FIG. 5C, current provided by the source and drain electrodes 42, 46 and controlled by a voltage provided through the gate electrode 44 passed through the interface between the source 22 and drain 26 of portion P1 does not experience any additional resistance from portions P2-P4. However, the current passing through the source/drain interface of portion P2 must pass through P1. The current passing through the source/drain interface of portion P3 must pass through P1 and P2 and current passing through the source/drain interface of portion P4 must pass through portions P1, P2, and P3, so that the current passing through the portions P2, P3, and P4 experiences resistive losses and heat generation.

Comparing the electrical current flow and resistance of FIGS. 5A and 5B, with the disaggregated component transistor 21 of FIGS. 3A-2C, there is no current resistive loss or heat generation in each of the transistor elements 40 of components 20 specifically due to other transistor element 40 portions (e.g., where each disaggregated component transistor 21 transistor element 40 corresponds to a portion). However, there is current loss and resistive heating within the component connection 30 of FIGS. 3A-2C due to the connection resistance, but this current loss and resistive heating can be less than the current loss and resistive heating due to portions P2-P4 in a conventional transistor. Therefore, according to some embodiments of the present disclosure, as long as the connection resistance is less than, less than an average of, or less than the sum of the transistor element resistances of the corresponding transistor elements 40 within the components 20, the multi-component transistor structure 99 of FIGS. 3A-4B will provide a performance advantage of reduced resistive heating, providing improved efficiency, switching rates, and reduced resistive, capacitive, or inductive parasitic losses, for example switching losses. In turn, such improvements provide an increased power density, peak voltage, and current in multi-component transistor structure 99.

Since component connection 30 can be constructed externally to component 20 or transistor element 40, it can be made, in various embodiments, with more conductive materials, wider materials, or thicker materials, or have a shorter length, as illustrated, all of which provide reduced resistance, reduced heating, improved switching rates, and reduced parasitics (e.g., resistive, capacitive or inductive parasitics) in multi-component transistor structure 99. Component connection 30 can also be constructed at a lower resolution than component 20, saving manufacturing costs. A device resolution is the smallest dimension parallel to a substrate surface (e.g., x and y dimensions but not z dimension) of the device or the smallest separation between devices, whichever is smaller. The resolution of component 20 is the resolution of a transistor element 40 in component 20. Component connection 30 can also be constructed separately from component 20, in a different process, with different materials, at a separate time, and disposed externally to component 20.

For ease of understanding, the examples of FIGS. 4A, 4B, and 5C arbitrarily use an illustration with four portions, but in an actual implementation, the increase in resistance along a length $L_E$ of transistor element 40 is continuous. Mathematically, the transistor element resistance for linear structures connected at one end can be computed as the integral of the element length $L_E$ or $\frac{1}{2} kx^2$ (where x is the element length $L_E$ and k is the resistance in ohms per square of transistor element 40) and the connection resistance y is similar. This is equivalent to the area under a line with a slope k that extends from zero to the transistor element length $L_E$ of transistor element 40 or component connection length $L_C$ component connection 30. For a multi-component transistor structure 99 with four components 20 as in FIGS. 3A-4B where the resistance of transistor element 40 is arbitrarily chosen to be twice the resistance of component connection 30 and four portions of the equivalent structure in FIGS. 5A, 5B), the structure of FIGS. 5A-5C has a transistor element resistance of sixteen (one half of four squared times 2) and the multi-component transistor structure 99 of FIGS. 3A-4B has a transistor element resistance of two (four times one half of one squared) times one.

Figure 6D:
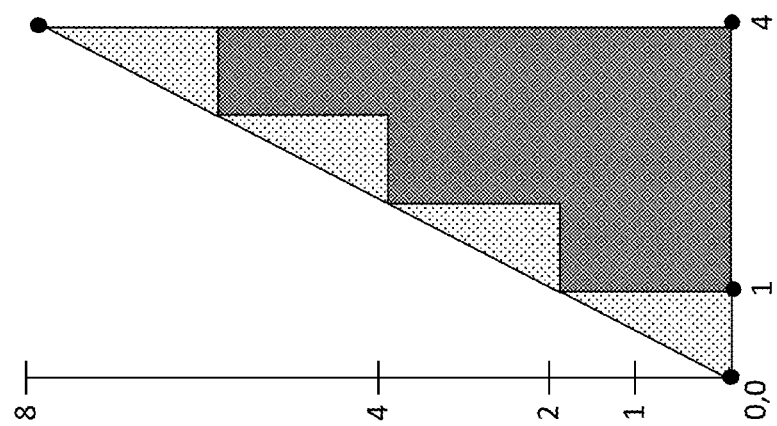
FIGS. 6A-6D are graphs illustrating functions useful in understanding some embodiments of the present disclosure.
Figure 6C:
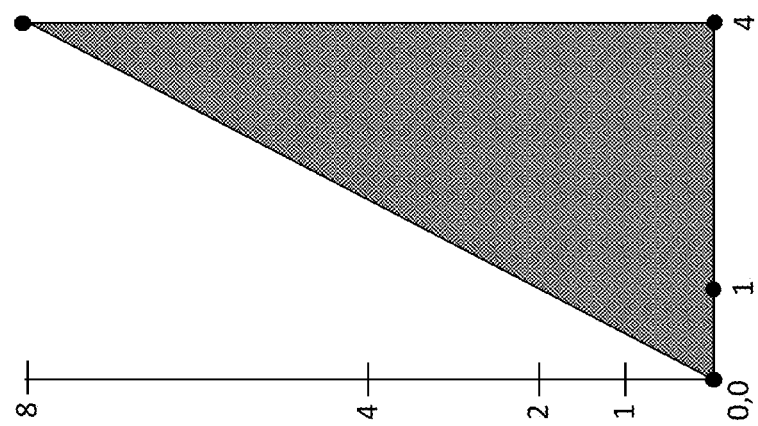
Figure 6A:
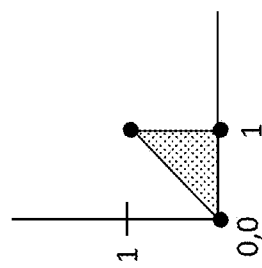
Figure 6B:
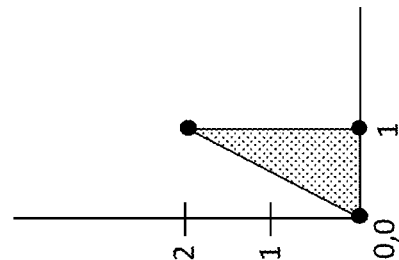

FIGS. 6A-6C graphically illustrate the calculation. Assuming that the length of component connection 30 is the same as the length of transistor element 40 (transistor element length $L_E$ and arbitrarily selected as one) and that the resistance of transistor element 40 is twice that of component connection 30, the shaded area under the line in FIG. 6A illustrates the connection resistance equal to ½ or ($\frac{1}{2} \times 1^2$)×1 (where the x axis represents the element length $L_E$ equal to one, k is the resistance in ohms per square of transistor element 40 equal to 2, and the y axis equals $f(x) = \frac{1}{2} kx^2$). As shown in FIG. 6B, the transistor element resistance equals 1 or ($\frac{1}{2} \times 1^2$)×2. In comparison, a corresponding non-disaggregated device, illustrated in FIG. 6C, has a resistance of sixteen or ($\frac{1}{2} \times 4^2$)×2. FIG. 6D illustrates the difference in area between four transistor elements 40 (as shown in FIG. 6B) and one non-disaggregated device as shown in FIG. 6C.

The multi-component transistor structure 99 of FIGS. 3A-4B also has component connection 30 losses from the connection resistance, calculated as ½ above. The net resistance of multi-component transistor structure 99 for a given component connection 30 and transistor element 40 is thus (number of transistor elements 40 times transistor element resistance) plus connection resistance, or (four times one) plus ½, equal to 4.5, compared to sixteen as noted above. Thus, a performance improvement factor can be 16/4.5 or about 3.56.

Following this illustrative example, the performance of multi-component transistor structure 99 can be modeled as:
$L_T$=length of transistor (e.g., FIG. 5C);
N=number of transistor elements 40 (e.g., 4, FIGS. 3A-3E);
$L_E$=length of transistor element 40 equal to $L_T/N$ (e.g., FIG. 3A);
$L_C$=length of component connection 30 (e.g., FIGS. 3A-3D, 4B);
Transistor element resistance E=½($L_E^2$)R=½R($L_T/N$)$^2$;
Relative resistance R=transistor element resistance per/ connection resistance per;
Transistor resistance T=½($L_T^2$)×R;
Connection resistance C=½($L_C^2$);
Multi-component resistance M=(N×E)+C; and
Performance factor P=T/M=(½($L_T^2$)R)/((N×½($L_T/N$)$^2$× R)+½($L_C$)$^2$).

For the example above, $L_T$=4, N=4, $L_C$=$L_E$=1, R=2, so that:

$$P=(\tfrac{1}{2}(4^2)2)/((4\times\tfrac{1}{2}\times 2)+\tfrac{1}{2}(1)^2)=16/(4+\tfrac{1}{2})=16/4.5=3.56.$$

In general, the performance factor P is improved by increasing N (the number of components 20 and thereby decreasing the length $L_E$ of each transistor element 40 in components 20), by decreasing $L_C$ (the length of component connection 30 length), and by decreasing R (the resistance of component connection 30). However, as N is increased, it is likely that $L_C$ will also increase, so that an actual performance factor P will be a matter of design choice. It is helpful to pack components 20 as closely together as is possible to meet design goals since a dense arrangement of components 20 can also reduce $L_C$, for example by reducing component separation distance S with respect to component width W. R can be reduced by improving the conductivity of component connection 30, for example by using thick and conductive materials such as copper or gold. In embodiments in which component 20 comprises multiple transistor elements 40, a performance factor P can be obtained for each transistor element 40 in component 20, further improving the overall performance of multi-component transistor structure 99.

Thus, according to some embodiments of the present disclosure, a multi-component transistor structure 99 comprises stacked components 20 having component transistors 21 electrically connected in parallel, each of component transistors 21 comprising at least a transistor element 40 having a transistor element resistance, and a component connection 30 electrically connected to transistor element 40 of each component 20. A material, material width, or material thickness of component connection 30 can be different from a material, material width, or material thickness of transistor element 40. Component connection 30 has a connection resistance and transistor element 40 has a transistor element resistance. An integral of a connection resistance function taken over a length of component connection 30 is less than an integral of a transistor element resistance function taken over a sum of the lengths of transistor elements 40, the connection resistance function is $f(x)=C_{RX}$ where $C_R$=(the connection resistance divided by a length of component connection 30), and the transistor element resistance function is $f(x)=E_{RX}$ where $E_R$=(the transistor element resistance divided by a transistor length $L_T$).

In some embodiments, components 20 can be disposed closely together, for example separated by a separation distance S that is less than a width W of components 20 (as shown in FIGS. 3A-3E and made possible by using bare die 98 components 20). This enables a short component connection 30 so that according to some embodiments of the present disclosure, a multi-component transistor structure 99 comprises components 20 electrically connected in parallel, each of components 20 comprising at least a transistor element 40 and a component connection 30 electrically connected to transistor element 40 of each component 20. A material, material width, or material thickness of component connection 30 can be different from a material, material width, or material thickness of transistor element 40.

The length of component connection 30 can be less than transistor length $L_T$ times the number of components 20. Thus, in some embodiments of a multi-component transistor structure 99, a length of component connection 30 is less than a sum of the lengths of transistor elements 40 of components 20, is less than an average of the lengths of transistor elements 40 of components 20, is less than the longest length of any transistor element 40 of components 20, or is less than the shortest length of any transistor element 40 of components 20. A shorter component connection 30 has reduced resistive and parasitic losses in multi-component transistor structure 99 providing improved efficiency.

Groups of multi-component transistor structures 99 can be provided and electrically connected together. In some embodiments, the group itself is a multi-component transistor structure 99, for example where a group component connection 30 comprises a combination of each of component connections 30 of each multi-component transistor structure 99 together and the connection resistance is the resistance of the group component connection 30 and the sum of the transistor element resistances is the sum of all of transistor elements 40 of components 20 in each of the multi-component transistor structures 99. In other embodiments, the group of multi-component transistor structures 99 is not itself a multi-component transistor structure 99.

As discussed above, each of components 20 can include one or more component transistors 21, for example field-effect transistors (FETs), power transistors, or radio frequency (RF) transistors, or any one or combination thereof, and can be applied, for example, in power amplifiers in mobile devices or in automotive applications. Component transistors 21 can have multiple transistor elements 40, e.g., a source 22, gate 24, and drain 26, each with an electrically separate component connection 30, e.g., a component source connection 32 electrically connected to source 22 of components 20, a component gate connection 34 electrically connected to gate 24 of components 20, and a component drain connection 36 electrically connected to drain 26 of components 20. In some embodiments, component gate connection 34 is more conductive than a conductivity of gate 24 of any component transistors 21, component source connection 32 is more conductive than a conductivity of source 22 of any of component transistors 21, or component drain connection 36 is more conductive than a conductivity of drain 26 of any of component transistors 21, or any combination thereof. In some embodiments, component gate connection 34 is shorter than a gate 24 length of any of component transistors 21, component source connection 32 is shorter than a source 22 length of any of component transistors 21, or component drain connection 36 is shorter than a drain 26 length of any of component transistors 21, or any combination thereof. In some embodiments, component gate connection 34 is shorter than a sum of gate 24 lengths of component transistors 21, component source connection 32 is shorter than a sum of source 22 lengths of component transistors 21, or component drain connection 36 is shorter than a sum of drain 26 length of component transistors 21, or any combination thereof.

Figure 20:
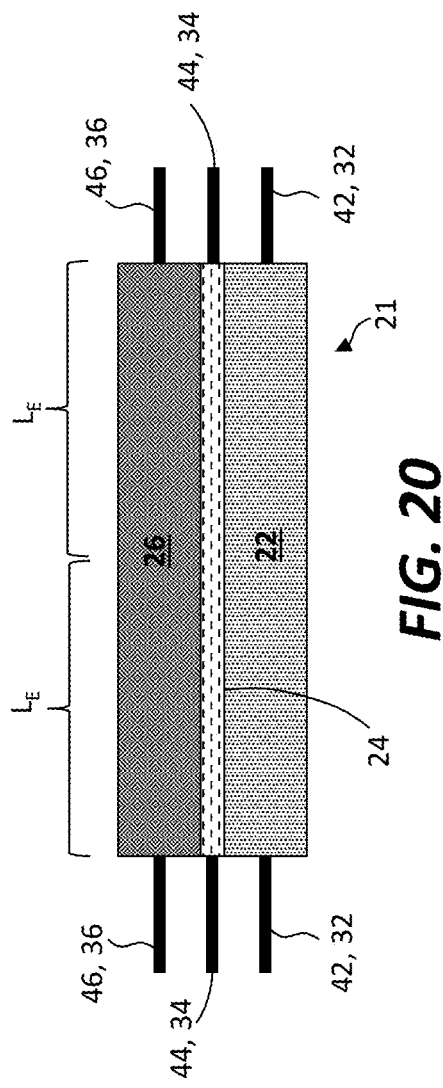
FIG. 20 is a plan view illustrating embodiments of the present disclosure having multiple transistor element connections.
Figure 21:
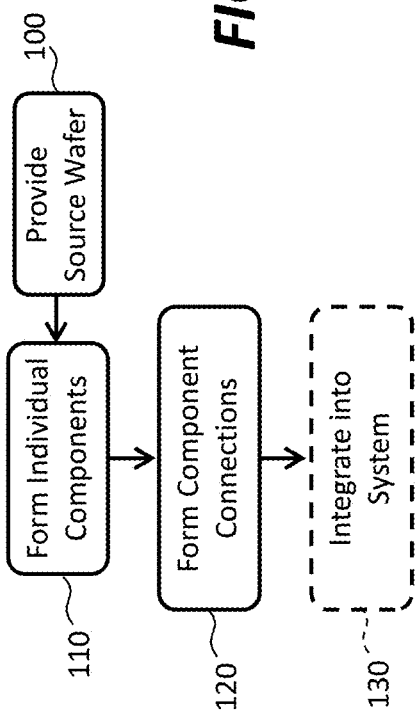
FIGS. 21-24 are flow diagrams according to illustrative methods of the present disclosure.

In some embodiments, source 22 of each component transistor 21 comprises a source material and component source connection 32 comprises an electrical conductor material that is different from the source material, drain 26 of each component transistor 21 comprises a drain material and component drain connection 36 comprises an electrical conductor material that is different from the drain material, or both. In some embodiments, component source, gate, and drain connections 32, 34, 36 are first component source, gate, and drain connections 32, 34, 36 and components 20 comprise second component source, gate, and drain connections 32, 34, 36, for example as shown in FIG. 20, connected at both ends of linear source 22, gate 24, and drain 26 of component transistor 21. In FIG. 20, component connections 30 at each end of each transistor element 40 (e.g., source, gate, and drain electrodes 42, 44, 46) are electrically connected in common (not shown) and are at least a portion of the corresponding component source, gate, and drain connections 32, 34, 36. Because the source, gate, and drain 22, 24, 26 are electrically connected at both ends, their effective length is one half that of a source, gate, and drain 22, 24, 26 connected at only one end.

Thus, according to embodiments of the present disclosure, a multi-transistor structure 99 comprises a plurality of stacked component transistors 21 electrically connected in parallel, each component transistor 21 comprising at least a gate 24 having a gate resistance, a source 22 having a source resistance, and a drain 26 having a drain resistance. A component gate connection 34 is electrically connected to gates 24 of each component transistor 21 at two or more locations, a component source connection 32 is electrically connected to source 22 of each component transistor 21 at two or more locations, and a component drain connection 36 is electrically connected to drain 26 of each component transistor 21 at two or more locations. Any one or combination of a material, material width, or material thickness of component source connection 32 can be different from a material, material width, or material thickness of source 22 or source electrode 42, a material, material width, or material thickness of component gate connection 34 can be different from a material or material thickness of gate electrode 44, and a material, material width, or material thickness of component drain connection 36 can be different from a material or material thickness of drain 26 or drain electrode 46.

In some embodiments, the resistance of component source connection 32 is less than, less than the average of, or less than the sum of the source resistances of the component transistors 21, the resistance of the component drain connection 36 is less than, less than the average of, or less than the sum of the drain resistances of component transistors 21, the resistance of component gate connection 34 is less than, less than the average of, or less than the sum of the gate resistances of component transistors 21, or any combination thereof. In some embodiments, an integral of the connection resistance of component source connection 32, taken over the length of component source connection 32 is less than an integral of the source resistance taken over a length of source 22, an integral of the connection resistance of component gate connection 34 taken over the length of component gate connection 34 is less than an integral of the gate resistance taken over a length of gate 24, or an integral of the connection resistance of component drain connection 36 taken over the length of component drain connection 36 is less than an integral of the drain resistance taken over a length of drain 26, or any combination thereof. For example, an integral of a source connection resistance function taken over a length of component source connection 32 can be less than an integral of a source resistance function taken over a sum of the lengths of sources 22; the source connection resistance function can be $f(x)=C_{RX}$ where $C_R=$(a resistance of component source connection 32 divided by a length of component source connection 32), and the source resistance function is $f(x)=E_{RX}$ where $E_R=$(source resistance divided by a length of source 22). An integral of a gate connection resistance function taken over a length of component gate connection 34 can be less than an integral of a gate resistance function taken over a sum of the lengths of gates 24; the gate connection resistance function can be $f(x)=C_{RX}$ where $C_R=$(a resistance of component gate connection 34 divided by a length of component gate connection 34), and the gate resistance function is $f(x)=E_{RX}$ where $E_R=$(gate resistance divided by a length of gate 24). An integral of a drain connection resistance function taken over a length of component drain connection 36 can be less than an integral of a drain resistance function taken over a sum of the lengths of drains 26; the drain connection resistance function can be $f(x)=C_{RX}$ where $C_R=$(a resistance of component drain connection 36 divided by a length of component drain connection 36), and the drain resistance function is $f(x)=E_{RX}$ where $E_R=$(drain resistance divided by a length of drain 26).

As illustrated in FIGS. 7A-8C and also with reference to FIGS. 1A, 1B, 2A, and 2B, components 20 can be disposed individually or in a row or layer on support substrate 10. Rows of components 20 can be disposed on each other in layers, as shown, to form a stacked configuration with excellent density and short component connections 30. As shown in FIGS. 7A, 1B, 2A, and 2B, each component 20 is substantially (within manufacturing tolerances) the same size and the layers of components 20 have the same number of components 20. As shown in FIGS. 7B and 1A, components 20 can have different sizes. First component 20A is the largest and is disposed on support substrate 10, second component 20B is slightly smaller than first component 20A and is disposed on first component 20A, and third component 20C is the smallest and is disposed on second component 20B. Components 20 in a component stack 28 can be successively smaller in length, in width (as shown in FIG. 7B), or in both length and width, as shown in the perspective of FIG. 1A. By using increasingly smaller components 20 in component stack 28, connections to components 20 in component stack 28 can be facilitated, as discussed further with respect to FIGS. 18A-18C below. Component stacks 28 illustrated in FIGS. 2A, 2B, and 7A are aligned component stacks 28. Component stacks 28 illustrated in FIGS. 7B, 1A, and 1B are offset component stacks 28.

As illustrated in FIGS. 8A-8C, components 20 can be the same size (e.g., as in FIG. 7A) and component stack 28 can be offset, with each successive layer comprising a successively smaller number of components 20, forming a step pyramid of components 20. Such an offset component stack 28 can have simpler component connections 30 (as illustrated and discussed further below with respect to FIG. 15). FIG. 8A illustrates a two-layer offset component stack 28 with the upper layer having a single component 20, FIG. 8B illustrates component stack 28 with a center location in a second layer devoid of a component 20, and FIG. 8C illustrates a three-level or three-layer structure offset component stack 28 of components 20. Component 20 stacks illustrated in FIGS. 8A, 8B, and 8C are offset component stacks 28.

Components 20 can each be individually disposed on support substrate 10 by micro-transfer printing, for example as individual die 98 or units. In some embodiments, multiple components 20 are disposed on support substrate 10 as a single die 98 and transfer printed as a single die 98 to form each row (or a portion of a row) within a stacked structure on support substrate 10. Where a multi-component transistor structure 99 comprises stacked components 20 or rows of components 20, either components 20 comprising individual dies 98 or multiple components 20 comprising a single die 98 can be micro-transfer printed on top of pre-disposed components 20 to form component stack 28 (or a portion thereof).

Figure 9A:
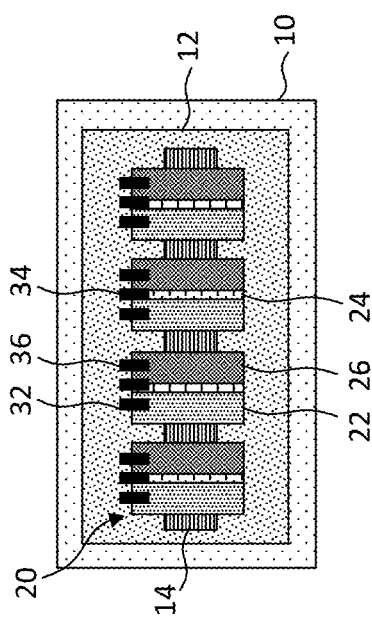
FIG. 9A is a plan view and FIG. 9B is a cross section of a component transistor structure comprising a circuit and thermal conductor according to illustrative embodiments of the present disclosure.
Figure 9B:
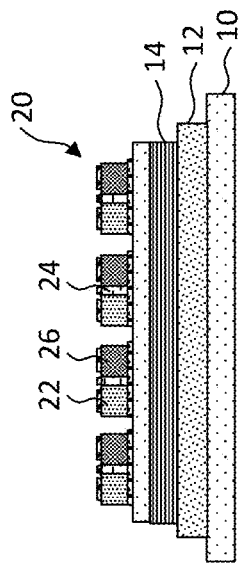

As shown in FIGS. 9A and 9B, a heat conductor 14 can be disposed on support substrate 10 and extend beneath one or more of components 20 to transfer heat from components 20 and improve cooling of the structure. For clarity, FIGS. 9A and 9B omits component connections 30.

As is also shown in FIGS. 9A and 9B, support substrate 10 can comprise an electronic circuit 12 connected to components 20 with vias formed through heat conductor 14 (not shown in FIGS. 9A-9B). Electronic circuit 12 can be disposed in or on support substrate 10. Components 20 can be disposed on (e.g., directly on or over) electronic circuit 12 and can be electrically connected to electronic circuit 12. Electronic circuit 12 can control or respond to components 20 or provide signals or power and ground to components 20. For example, electronic circuit 12 can be a power FET control circuit. Support substrate 10 can be a semiconductor substrate such as silicon and electronic circuit 12 can be a digital, analog, or mixed signal circuit, for example comprising CMOS transistors. Thus, some embodiments of a multi-component transistor structure 99 comprise a silicon support substrate 10 comprising an electronic circuit 12 that is electrically connected to any combination of component source connection 32, component gate connection 34, and component drain connection 36.

Although component substrates 56 can have a common origin and materials (e.g., component source wafer 60), when transferred to support substrate 10 (e.g., by micro-transfer printing from component source wafer 60 and forming fractured or separated tethers 52), component substrates 56 are completely separated, discrete, distinct, and individual and are separated on support substrate 10 by separation distance S (shown in FIGS. 3A-3C). Once components 20 are disposed on support substrate 10, component connections 30 can be disposed and patterned on components 20 and the common semiconductor substrate, for example using any one or combination of different materials, different material thicknesses, and different processes (e.g., as illustrated in FIGS. 3A-3E). In some embodiments, component connections 30 are constructed at a different resolution from structures in components 20 or transistor elements 40, for example using different process methods or materials, or both. Support substrate 10 can be diced or, if part of a support substrate source wafer, micro-transfer printed with multi-component transistor structure 99 into an external structure, such as a desired product or system.

Components 20 can be made in or comprise a substrate such as a semiconductor substrate or compound semiconductor substrate, for example a III/V compound semiconductor such as GaN or GaAs or a II/VI compound semiconductor. Thus, each of components 20 can comprise a component substrate 56 comprising a component material (e.g., GaN or GaAs) that is different from a support substrate 10 material (e.g., silicon or glass). Components 20 can be substantially identical in function, size, and shape, or have different sizes or shapes. By substantially identical is meant designed to be and operate the same within the constraints of a manufacturing process. Components 20 can be chiplets or micro-chiplets and can comprise bare die 98 that are not provided in a package with additional electrical connections to transistor elements 40 in components 20 (e.g., bond wires connected to pins). Such bare die 98 components 20 reduce costs and improve performance, as well as component density. Bare die 98 can be processed on support substrate 10, for example using photolithographic materials and methods, to provide, for example insulating dielectric structures 58, conductors such as component connections 30, or other useful circuit structures.

In some embodiments and as shown in FIG. 10A, components 20 can be formed in a component source wafer 60 that includes a wafer of source substrate material having a patterned sacrificial layer 68 that is formed on or in the source substrate material or that is a designated portion of the source substrate material (e.g., an anisotropically etchable portion). Component transistors 21 can comprise semiconductor materials as well as dielectric structures 58, conductors, vias, and other structures useful in integrated circuits that can be formed using photolithographic methods and materials. Patterned sacrificial layer 68 defines separate anchors 64 between sacrificial portions 66 of the patterned sacrificial layer 68. Each component 20 can be disposed over a separate sacrificial portion 66 and attached to anchors 64 by one or more component tethers 62 over sacrificial portion 66. Such components 20 can be micro-transfer printed to support substrate 10, as shown in FIGS. 3B and 3C, and can comprise fractured or separated tethers 52 (e.g., as shown in FIG. 3C) when micro-transfer printed.

As shown in FIG. 10B, a group of components 20 (for example forming a multi-component transistor structure 99) sharing a common component substrate 57 can be formed or disposed over each sacrificial portion 66 of sacrificial layer 68 and attached to anchors 64 by one or more component tethers 62 over sacrificial portion 66. Such multi-component transistor structures 99 can be micro-transfer printed as a component to support substrate 10, as shown in FIGS. 3D and 3E, and can comprise broken (e.g., fractured) or separated tethers 52 (FIG. 3D).

Figure 11A:
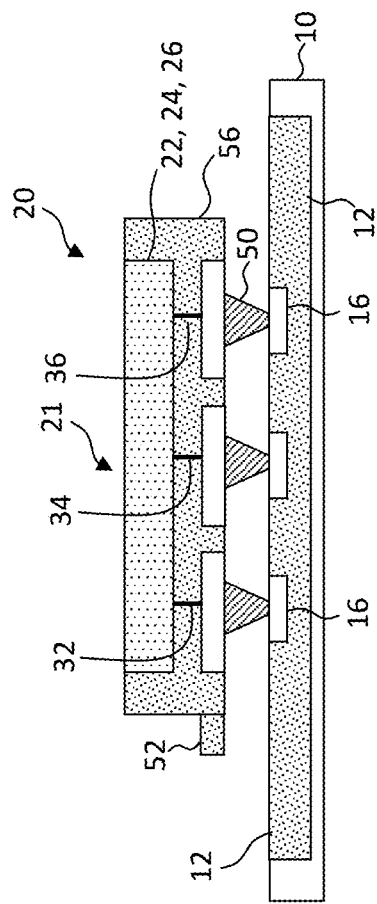
FIGS. 11A and 11B are detail and large-scale cross sections, respectively, of component(s) comprising connection posts electrically connected to contact pads according to illustrative embodiments of the present disclosure.
Figure 11B:
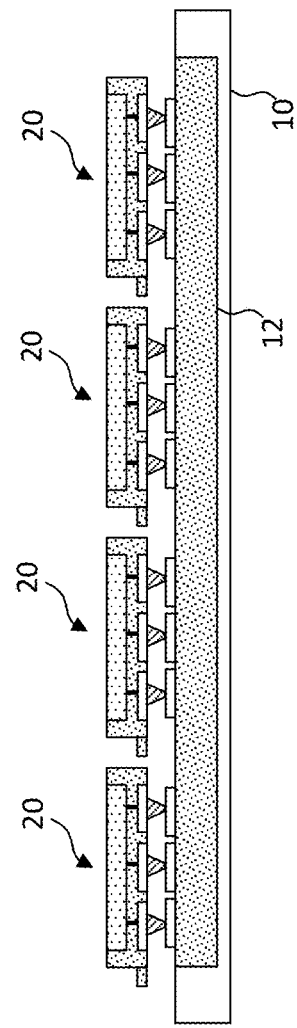

As shown in the detail of FIG. 11A and system of FIG. 11B, component transistors 21 can be electrically connected to connection posts 50 with component connections (e.g., component source, gate, and drain connections 32, 34, 36) and can be micro-transfer printed from component source wafer 60 using a stamp to adhere components 20 and remove components 20 from component source wafer 60, fracturing component tethers 62 to form fractured tethers 52, and printed onto support substrate 10 to contact connection posts 50 to contact pads 16 on support substrate 10. In some embodiments, component connections 30 are electrically connected to contact pads 16 using photolithographic methods and materials. Contact pads 16 can be electrically connected to electronic circuit 12, so that electronic circuit 12 is electrically connected to components 20.

Figure 12:
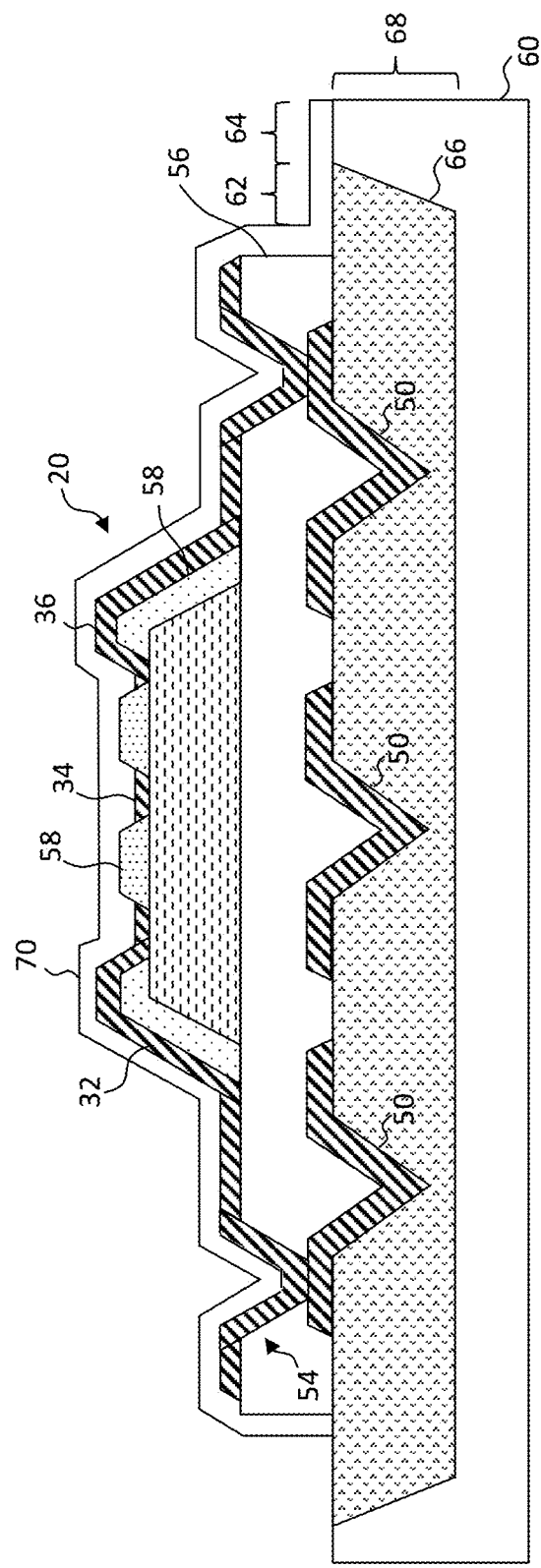
FIG. 12 is a cross section of a component with connection posts disposed on a component source wafer illustrating embodiments of the present disclosure.

As shown in FIG. 12, components 20 with connection posts 50 can be constructed on a component source wafer 60 by etching forms into sacrificial layer 68, patterning the forms with a conductor such as metal, disposing a component substrate 56 over the patterned conductor, forming component vias 54 through component substrate 56 and electrically connecting connection posts 50 through component via 54 to respective component source, gate, and drain connections 32, 34, 36. Dielectric structures 58 can insulate semiconductor materials from electrodes and component 20 can be protected by encapsulation layer 70 (or a planarization layer 70). Once formed, sacrificial portion 66 can be etched to form a gap between component 20 and component source wafer 60 to release component 20 from component source wafer 60 so that component 20 is held in position and suspended over component source wafer 60 by component tether 62 and anchor 64, breaking (e.g., fracturing) or separating component tether 62. Component 20 can then be micro-transfer printed with connection posts 50 using a stamp. Micro-assembly and photolithographic processes performed on support substrate 10 at a lower resolution can be less expensive than photolithographic processes performed at a higher resolution in an integrated circuit, for example panel processing is less expensive than wafer processing.

In some methods of the present disclosure illustrated in FIGS. 21-24, a multi-component transistor structure 99 is constructed by providing a component source wafer 60 in step 100 and constructing components 20 in step 110, for example using integrated circuit process methods and materials, such as photolithography in a semiconductor foundry. Each component 20 can comprise or be disposed on an individual, discrete, distinct, and different component substrate 56 and die 98 (e.g., as shown in FIG. 10A) or components 20 can comprise or be disposed on or in a common die 57 such as a common semiconductor substrate (e.g., common component substrate 57 shown in FIG. 10B), such as a compound semiconductor substrate. In step 120, component connections 30 are disposed and patterned on components 20 and semiconductor substrate 56 or common semiconductor substrate 57, for example using any one or combination of different materials, different material thicknesses, and different processes. In step 130, components 20 connected with component connections 30 on common semiconductor substrate 57 are integrated into a desired system.

Figure 22:
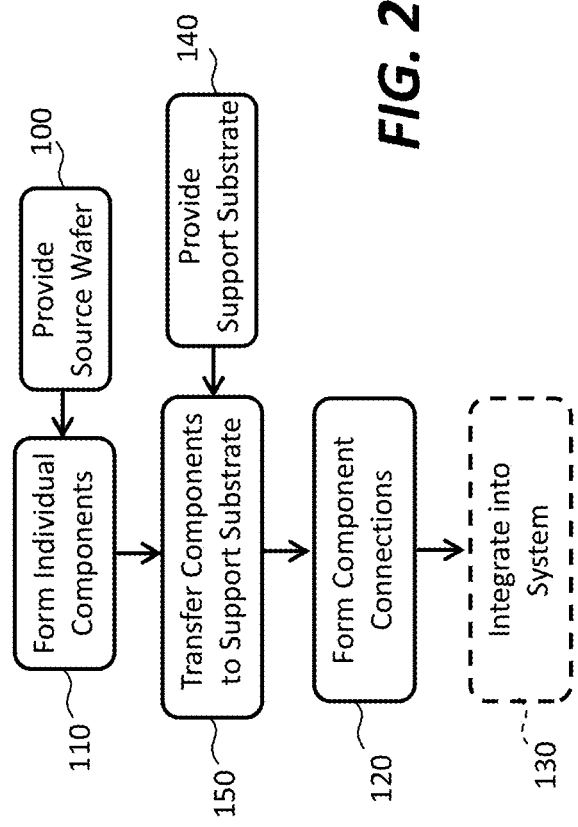
Figure 23:
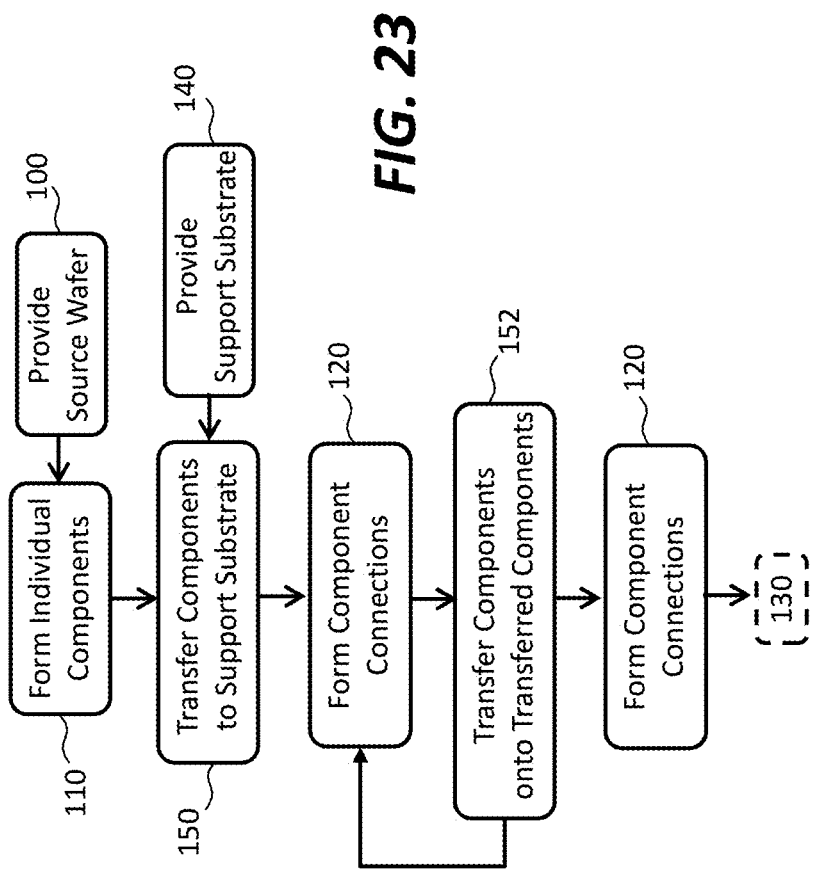
Figure 24:
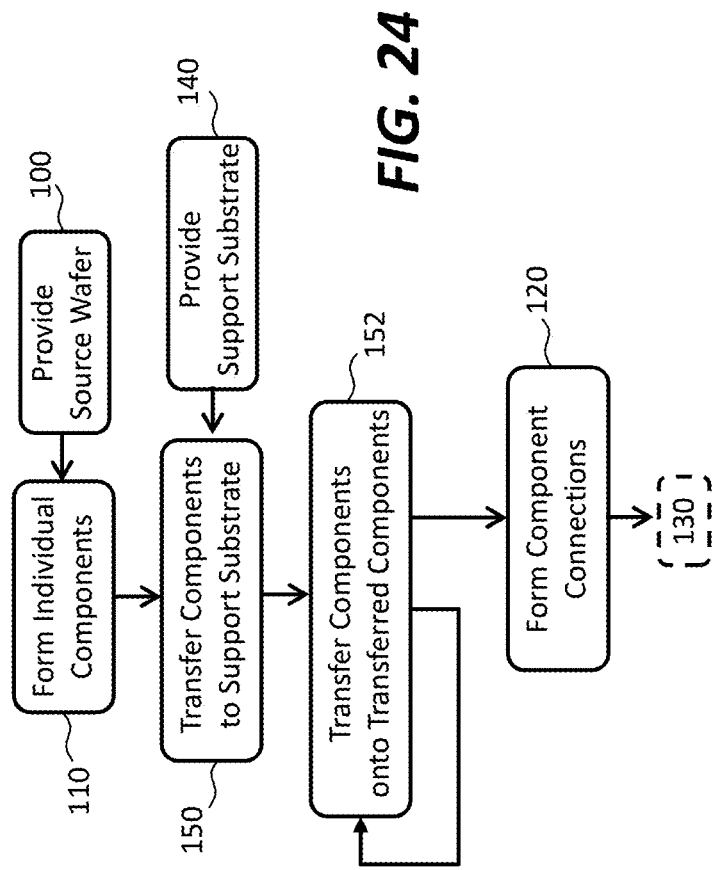

In some embodiments, and as shown in FIGS. 22-24, support substrate 10 is provided in step 140 and each component 20 is removed from the common semiconductor substrate (e.g., component source wafer 60) in step 150, for example by micro-transfer printing, and transferred to a support substrate 10. In some embodiments, each component 20 can comprise or be formed in or on and native to a separate and component substrate 56, for example an individual and discrete die 98 and can be transfer printed with a single stamp post. In step 120, component connections 30 are constructed and, in step 130, components 20 connected with component connections 30 can be integrated into a desired system.

FIGS. 23 and 24 illustrate successive transfer steps useful for constructing a stacked arrangement of components 20. As shown in FIG. 23, after a first set of components 20 (e.g., a first row of components 20) are disposed onto support substrate 10 (step 150) and electrically connected in parallel with component connection 30 (step 120), a second set of components 20 (e.g., a second stacked row of components 20) are disposed onto the first set of components 20 (step 152) and electrically connected in parallel with component connection 30 (repeated step 120). As shown in FIG. 24, a first set of components 20 are printed (step 150) followed by a second set on top of the first set (step 152). Both sets of components 20 are then electrically connected in parallel at the same time in a common step with component connection(s) 30. Disposing step 152 can be repeated, either interspersed with forming component connection step 150, as in FIG. 23, or followed by step 150, as in FIG. 24 to form an interconnected component stack 28 of components 20. According to embodiments of the present disclosure, after an offset component stack 28 of components 20 is formed, component connection(s) 30 can be made in a common step, reducing the number of photolithographic deposition and patterning steps, e.g., as shown in FIG. 1C.

In some embodiments, component connections 30 are constructed at a different (e.g., lower) resolution from structures in components 20 or transistor elements 40, for example using different process methods or materials, or both, (e.g., at a lower cost). In optional step 130, multi-component transistor structure 99 can be removed from the common semiconductor wafer, for example by dicing, or by micro-transfer printing into an external structure, such as a desired product or system, thereby forming fractured tethers 52 for support substrate 10. In such multi-component transistor structures 99, component substrate 56 can comprise at least a portion of and common materials with component source wafer 60 and can support one component (e.g., as shown in FIGS. 3A-3C) or multiple components 20 (e.g., as illustrated in FIGS. 3D and 3E). In some embodiments, support substrate 10 with multi-component transistor structure 99 can be micro-transfer printed or diced and transferred to a system, e.g., having a system substrate.

For a discussion of micro-transfer printing techniques see U.S. Pat. Nos. 8,722,458, 7,622,367 and 8,506,867, each of which is hereby incorporated by reference in their entirety. Micro-transfer printing using compound micro-assembly structures and methods can also be used with the present disclosure, for example as described in U.S. patent application Ser. No. 14/822,868, filed Aug. 10, 2015, entitled *Compound Micro Assembly Strategies and Devices*, which is hereby incorporated by reference in its entirety. U.S. Pat. No. 9,520,537, filed Jun. 18, 2015, entitled *Micro Assembled LED Displays and Lighting Elements*, incorporated herein by reference describes micro-transfer printing structures and processes useful with the present disclosure.

Figure 13:
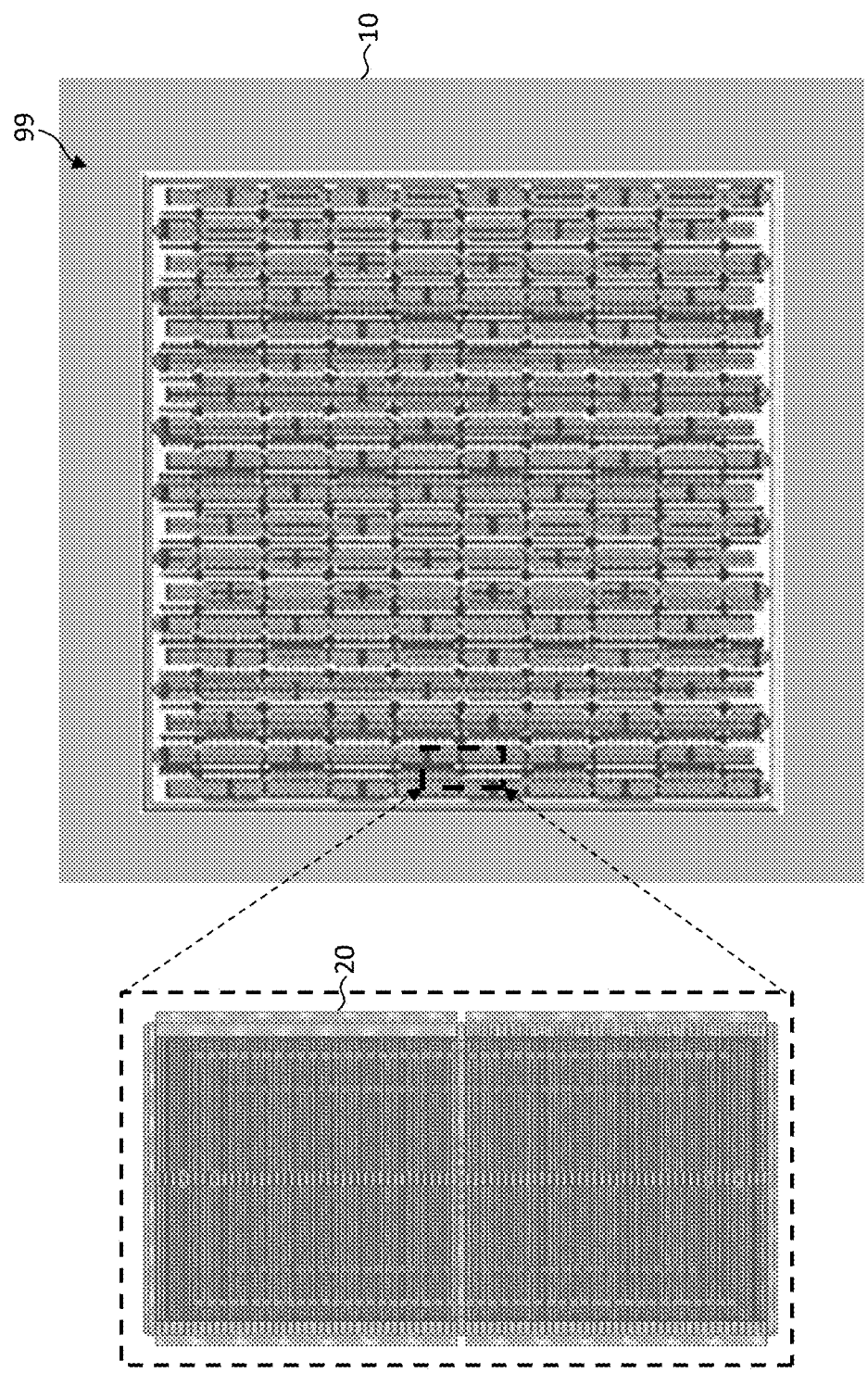
FIG. 13 is a plan view and detail layout of illustrative embodiments of the present disclosure.
Figure 14:
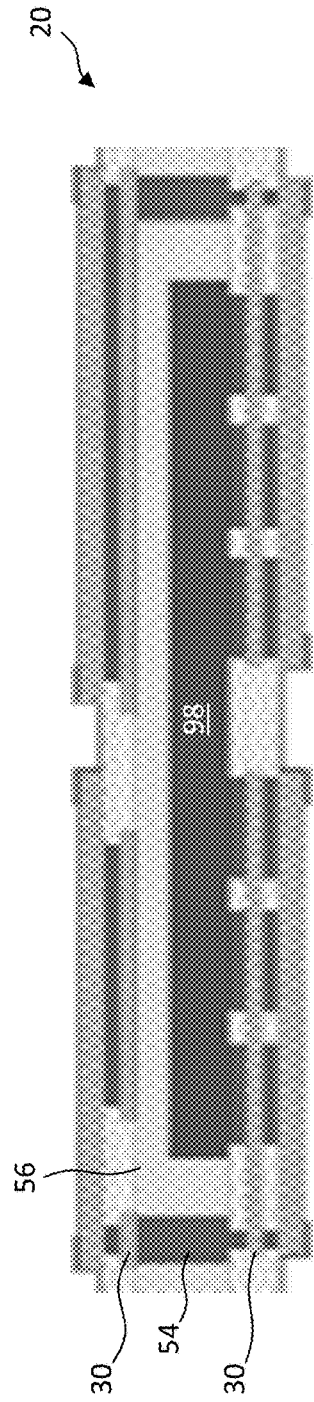
FIG. 14 is a schematic cross section of a component corresponding to FIG. 13 and illustrating embodiments of the present disclosure.

FIG. 13 is a detail and plan view of a component 20 design (an 8.5-micron thick power FET) and layout disposed on support substrate 10 and electrically connected in parallel with 3-micron thick component connections 30. Each component 20 has an area of 165 by 330 microns. This design comprises an 18 by 9 array of 162 components 20 covering approximately 3.2 mm by 3.2 mm. Components 20 can be arranged, for example, in three layers so that multi-component transistor structure 99 comprises 486 components 20. FIG. 14 is a detail of component 20 comprising a bare die 98 embedded in component substrate 56 (e.g., an FR4 core) together with dielectric structures 58, component vias 54, and portions of component connection 30 having a 100-micron thickness in component vias 54, reducing resistance in the vertical direction.

Figure 15:
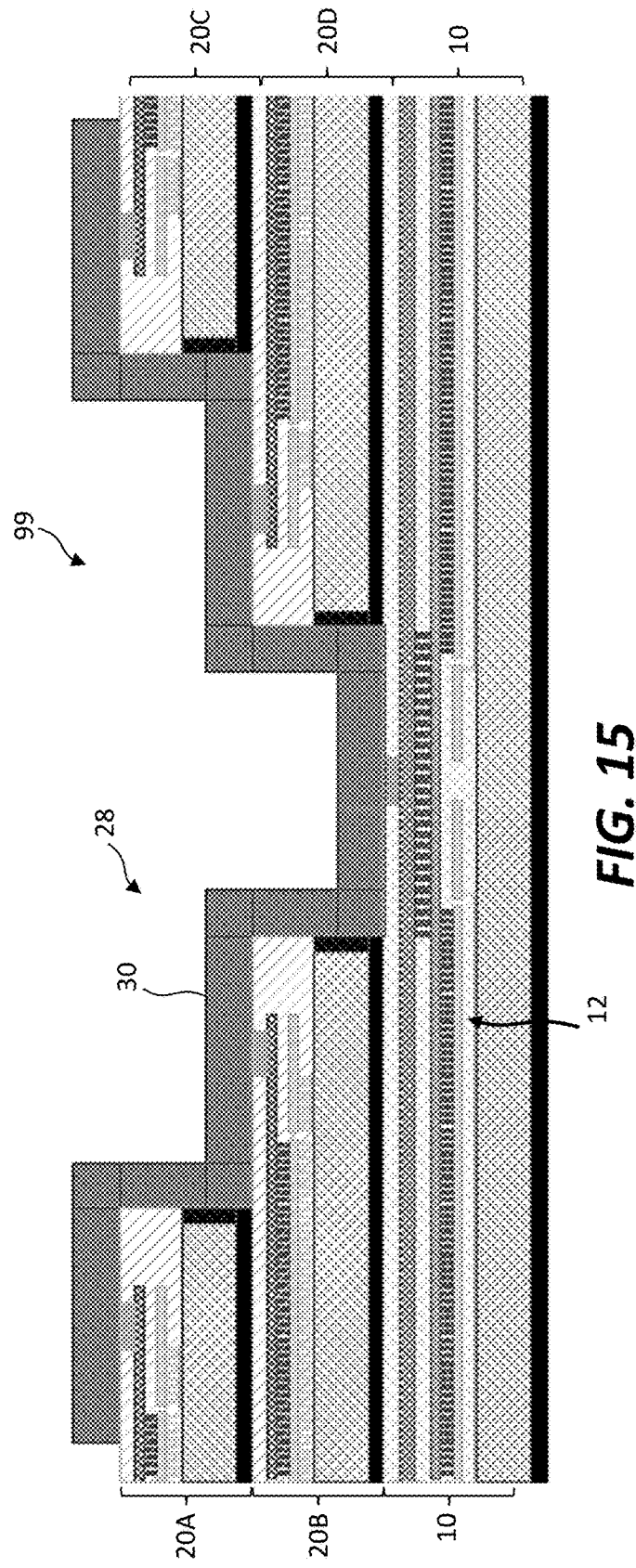
FIG. 15 is a schematic cross section of offset stacked components incorporating the component of FIG. 14 and a component connection illustrating embodiments of the present disclosure.
Figure 16:
FIG. 16 is a schematic cross section of the stacked component layout of FIG. 15 with additional layers of electrical connections according to illustrative embodiments of the present disclosure.
Figure 17:
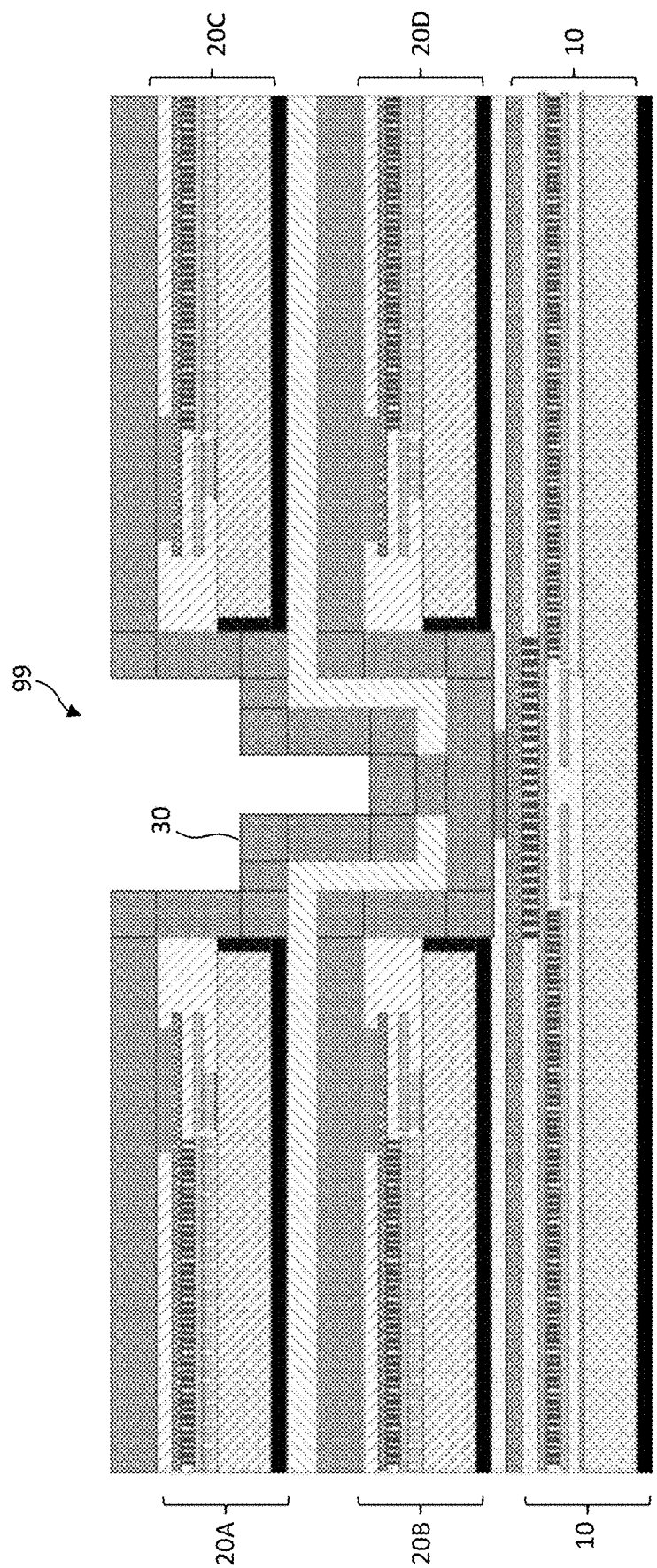
FIG. 17 is a schematic cross section of aligned stacked components incorporating the schematic of FIG. 14 according to illustrative embodiments of the present disclosure.

FIG. 15 illustrates a design and partial layout of an offset stacked configuration (e.g., corresponding to FIG. 8B) of first, second, third, and fourth components 20A-20D with component connections 30 disposed on a silicon support substrate 10 having an electronic circuit 12 to control components 20. FIG. 16 illustrates the structure of FIG. 15 with conductors 80 electrically connected to component connection 30 providing thick (e.g., 12-20 microns) multi-layer copper metal interconnects for conducting current to and removing heat from the multi-component transistor structure 99. The metal conductors 80 are 12, 18 and 20 microns thick and component vias 54 are 25 microns thick. In some embodiments, the metal is copper; such thick metal conductors (e.g., up to 100 microns thick) can be constructed using some embodiments of the present disclosure but are difficult or impossible to deposit on or with such small bare die 98 using conventional methods. FIG. 17 illustrates a stacked arrangement (corresponding to FIG. 7A) of aligned components 20 and component connections 30 disposed on a silicon support substrate 10 having an electronic circuit 12 to control components 20. Component stacks 28 illustrated in FIGS. 15 and 16 are offset component stacks 28 and FIG. 17 is an aligned component stack 28 as shown in FIGS. 2A-2C.

Figure 18:
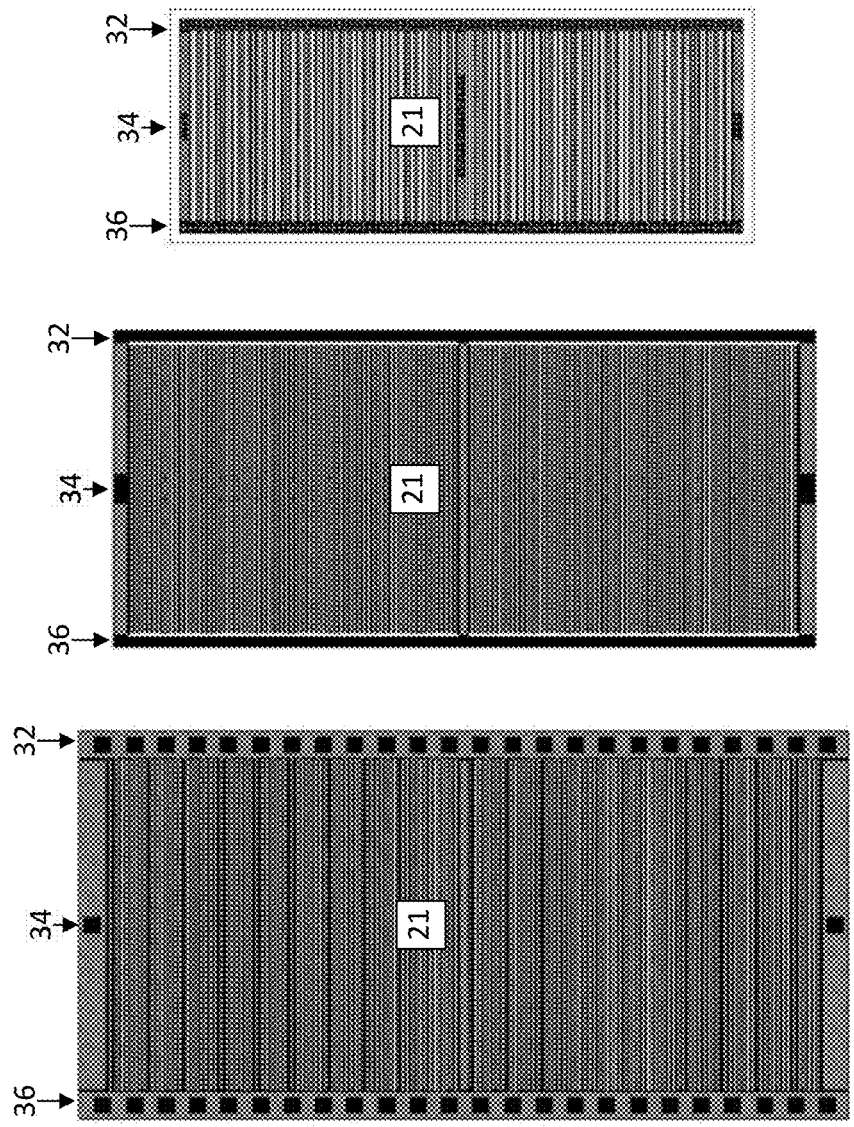
FIGS. 18A-18C are plan layouts having multiple transistor elements according to illustrative embodiments of the present disclosure.

FIGS. 18A-18C illustrate three components 20 comprising component transistors 21 that are interdigitated (e.g., interdigitated transistors 92 as shown in FIG. 5B) having different sizes that are suitable for a stacked multi-component transistor structure 99 configuration as shown in FIGS. 7B, 1A, and 1C). FIG. 18A illustrates the largest component 20, FIG. 18B illustrates a component 20 that is slightly smaller than the component 20 of FIG. 18A, and FIG. 18C illustrates a component 20 that is smaller than the component 20 of FIG. 18B, so that the three components 20 can be stacked directly on top of each other and the edges of the components 20 at each level (or layer) are exposed (as shown in FIGS. 7B, 1A, 1C, and 15) to form an offset component stack 28. By locating electrical contacts on the exposed edges (e.g., as shown in FIG. 15), components 20 can be electrically connected with a component connection 30 on the exposed edges, while maintaining a very dense configuration. Furthermore, connections along a length of a transistor element 40 can be made by disposing connections linearly along the exposed edge, for example along at least 50%, 60%, 70%, 80% or 90% of the exposed edge. As shown in FIG. 18A, component source and drain connections 32, 36 indicated by the dark rectangles are provided along the length of the exposed transistor elements 40 (e.g., drain 26 and source 22), optionally connected with component connections 30 through component vias 54 (not shown in FIGS. 18A-18C). For a transistor comprising a source 22, gate 24, and drain 26, by making components 20 successively smaller (e.g., as illustrated in FIG. 1C in perspective and FIG. 15 in cross section) in both length and width, transistor elements 40 electrically connected to a contact along a short side (the width) of component 20 can also be electrically connected with a component connection 30.

Thus, according to some embodiments of the present disclosure, a multi-component transistor structure 99 comprises components 20 electrically connected in parallel. Each component 20 comprises one or more transistor elements 40. Each transistor element 40 has a respective transistor element resistance. One or more component connections 30 each have a respective connection resistance, and each electrically connects to respective transistor elements 40 of components 20. The connection resistance is less than, less than an average of, or less than a sum of the transistor element resistances of the respective transistor elements 40 of each component 20. At least one component 20 is disposed on another component 20, for example in an aligned component stack 28 or an offset component stack 28. In some embodiments, all of components 20 are the same size. In some embodiments, components 20 in component stack 28 are successively smaller and the largest component 20 is disposed on support substrate 10 forming an offset component stack 28. In some embodiments, components 20 have a length and a width smaller than a length and electrical connections to transistor elements 40 that experience the greatest current (e.g., source 22 or drain 26) are disposed along an edge of component 20 in the length direction. Successive components 20 can be smaller in length, smaller in width, or smaller in both length and width. Relatively smaller components 20 can be disposed entirely over relatively larger components 20 so that no portion of the smaller component 20 extends beyond the larger component 20 or extends over an edge of the larger component 20. Components 20 can be, but are not necessarily, rectangular and can have other shapes, for example any polygon, and including curved shapes. Thus, one, two, three, four, or more edges of the larger components 20 in component stack 28 can be exposed.

In some embodiments, electrical connections to one or more transistor elements 40 are disposed on an exposed edge of a component 20. The electrical connection can be a component connection 30 that electrically connects transistor elements 40 in components 20 in a component stack 28 such as an offset component stack 28, for example as shown in FIG. 15. For example, an electrical connection to gate 24 can be located at one end of a bare die 98 comprising an interdigitated component transistor 21 (e.g., as shown in FIG. 5B) and electrically connected to a component gate connection 34 (e.g., as shown in FIG. 3A) and electrical connections to high-current source 22 and drain 26 can be made along the exposed edges along the length of the bare die 98 to respective component source connections 32 and component drain connections 36. Thus, a multi-component transistor structure 99 comprising stacked components 20 of FIGS. 18A-18C in a configuration such as that of FIG. 7B and electrically connected with component connections 30 as indicated in FIGS. 15 and 16 provides a more integrated, compact, and dense structure with improved performance, such as decreased resistance and heating and increased power and switching speed.

Figure 19:
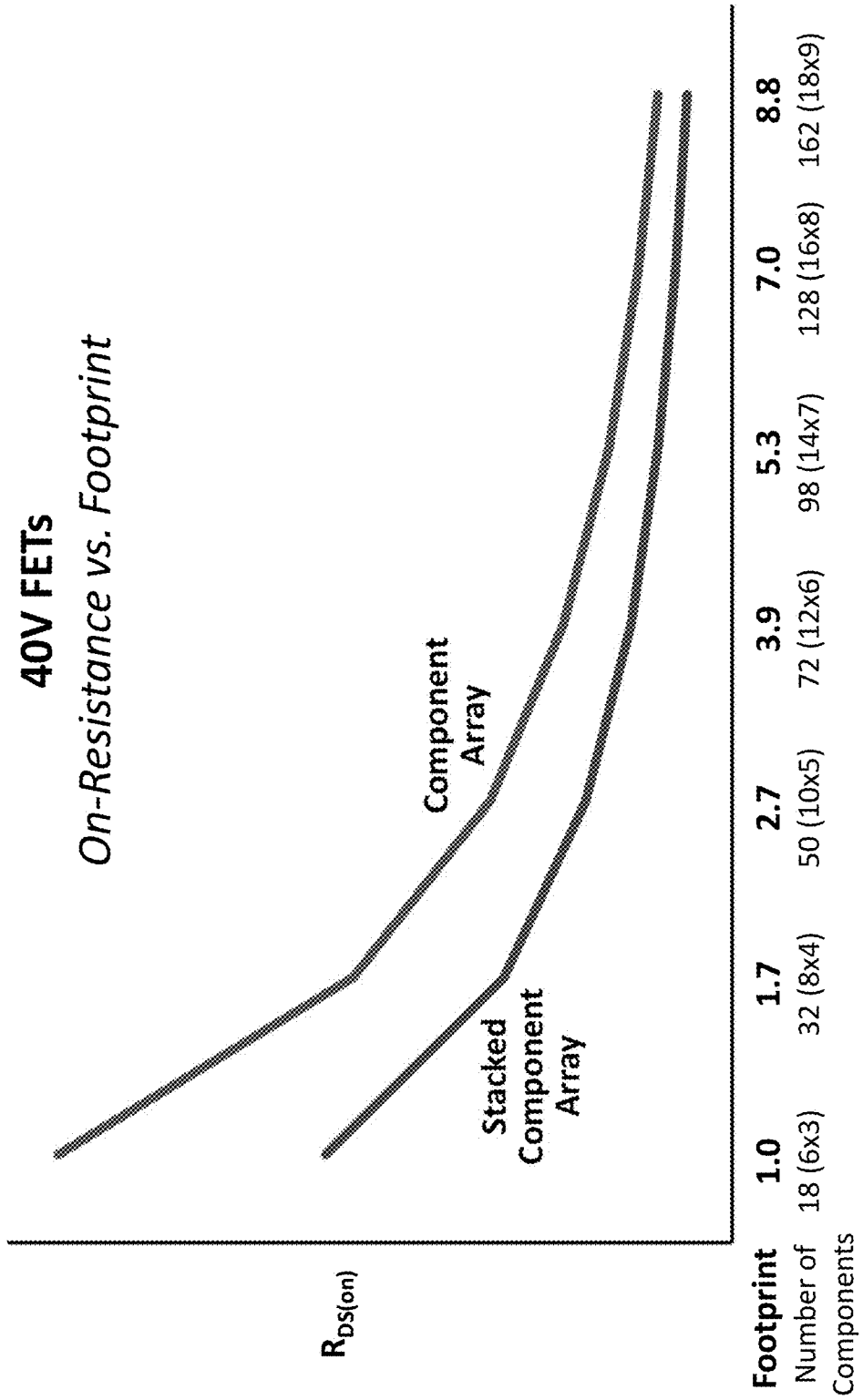
FIG. 19 is a graph comparing the source/drain resistance for various numbers of components useful in understanding some embodiments of the present disclosure.

FIG. 19 illustrates the relative reduction in source/drain resistance (Rds) modeled as a function of component 20 count and the relative area required for components 20 in a multi-component transistor structure 99 of the present disclosure for the component design of FIGS. 12 and 15 using 40-volt field-effect component transistors 21 (FETs). The upper line corresponds to a two-dimensional array of transistors and the lower line corresponds to a three-dimensional array of components 20 in a component stack 28 according to embodiments of the present disclosure and as shown in FIGS. 7B, 1A, 15, and 18A-18C. Further modeling, not illustrated, shows that as voltage increases (e.g., greater than 40V), relative performance of a stacked component array of multi-component transistor structure 99 with respect to a conventional component arrangement increases exponentially.

As shown in FIGS. 3A-3E, 11A, and 11B, components 20 or multi-component transistor structures 99 can be mounted upon, micro-transfer printed upon, or adhered to support substrate 10. As intended herein, to be mounted upon means that separate substrates are separately produced and then brought into proximity and adhered together in some fashion, for example by micro-transfer printing. The components 20 can be, for example, unpackaged bare die 98 so that each component 20 is in direct contact with the support substrate 10 or with an adhesive layer disposed on support substrate 10 (not shown). To be mounted upon, micro-transfer printed to, or adhered to electronic circuit 12 or support substrate 10 means that component transistor 21 is mounted upon, micro-transfer printed upon, or adhered to any of the circuits of electronic circuit 12 or support substrate 10, for example upon a semiconductor layer, a patterned or doped semiconductor layer or structure, a conductor layer or patterned conductor, a dielectric layer, a patterned dielectric layer, a protective layer, or any other portion of the electronic circuit 12, layers on support substrate 10, or support substrate 10.

Electronic circuit 12 can be a circuit that includes active or passive (or both) components or elements. For example, an active electronic circuit 12 can include a transistor, an amplifier, or a switch and, in some embodiments, can provide control functions to components 20. Electronic circuit 12 can be a silicon circuit in a silicon support substrate 10 for compound semiconductor components 20, such as GaN, GaAs, or InP, for example useful for power or radio frequency applications. Passive components such as conductors, resistors, capacitors, and inductors can also be included in electronic circuit 12. Portions of electronic circuit 12 can be electrically connected to circuit contact pads 16. Circuit contact pads 16 can be portions of electronic circuit 12 that are available to make electrical connections with electrical devices external to electronic circuit 12, for example such as controllers, power supplies, ground, or signal connections. Circuit contact pads 16 can be, for example, rectangular areas of electrically conductive materials accessible or exposed to external elements such as wires or conductors or component transistor 21 or any one or all of the component source, gate, and drain connections 32, 34, 36 and component connections 30. Electrical connections to the circuit contact pads 16 can be made using solder and solder methods, photolithographic processes, or by contacting and possibly penetrating the contact pads 16 with electrically conductive protrusions or spikes (e.g., connection posts 50) formed in or on a device with another substrate separate, distinct, and independent from support substrate 10 and connected to component transistors 21, for example as described in U.S. Pat. No. 10,468,363 entitled Chiplets with Connection Posts, whose contents are incorporated by reference in their entirety. Alternatively, the component transistor 21 can include connection posts 50 that are printed onto contact pads 16 of a support substrate 10.

Support substrate 10 and component transistors 21 can take a variety of forms, shapes, sizes, and materials. In some embodiments, component transistor 21 is thinner than support substrate 10. In some embodiments, support substrate 10 can have a thickness no greater than 500 microns (e.g., no greater than 100 microns, no greater than 50 microns, or no greater than 20 microns). In some embodiments, components 20 are chiplets, small integrated structures, for example bare die 98, that are micro-transfer printed to support substrate 10 and electrically connected using photolithographic materials and methods, or with connection posts 50 and contact pads 16. In various embodiments, component 20 has at least one of a width, a length, and a height from 2 to 50 µm (e.g., 2 to 5 µm, 5 to 10 µm, 10 to 20 µm, or 20 to 50 µm). In some embodiments, components 20 can have a thickness no greater than 20 microns (e.g., no greater than 10 microns, no greater than 5 microns, no greater than 2 microns, no greater than 1 micron, or no greater than 0.5 micron). Such a variety of sizes and small component substrates 56 can enable highly integrated and small structures useful in a corresponding variety of electronic systems and can provide a high degree of integration and material utilization and consequently reduced manufacturing costs and improved performance. Assemblies of integrated components 20 (e.g., multi-component transistor structure 99) can be subsequently packaged. Broken (e.g., fractured) or separated tethers 52 can have a thickness of several nm (e.g., no more than 50, 100, 200, 500, 700, or 800 nm) to a few µm (e.g., no more than 1-5 µm), for example from 600 nm to 1.5 µm. The integrated assembly (e.g., multi-component transistor structure 99) can be a surface-mount device.

As is understood by those skilled in the art, the terms "over", "under", "above", "below", "beneath", and "on" are relative terms and can be interchanged in reference to different orientations of the layers, elements, and substrates included in the present disclosure. For example, a first layer on a second layer, in some embodiments means a first layer directly on and in contact with a second layer. In other embodiments, a first layer on a second layer can include another layer there between. Additionally, "on" can mean "on" or "in." As additional non-limiting examples, a patterned sacrificial layer 68 or sacrificial portion 66 is considered "on" a substrate when a layer of sacrificial material or sacrificial portion 66 is on top of the substrate, when a portion of the substrate itself is the patterned sacrificial layer 68, or when the patterned sacrificial layer 68 or sacrificial portion 66 comprises material on top of the substrate or a portion of the substrate itself.

Having described certain embodiments, it will now become apparent to one of skill in the art that other embodiments incorporating the concepts of the disclosure may be used. Therefore, the disclosure should not be limited to the described embodiments, but rather should be limited only by the spirit and scope of the following claims.

Throughout the description, where apparatus and systems are described as having, including, or comprising specific components, or where processes and methods are described as having, including, or comprising specific steps, it is contemplated that, additionally, there are apparatus, and systems of the disclosed technology that consist essentially of, or consist of, the recited components, and that there are processes and methods according to the disclosed technology that consist essentially of, or consist of, the recited processing steps.

It should be understood that the order of steps or order for performing certain action is immaterial so long as the disclosed technology remains operable. Moreover, two or more steps or actions in some circumstances can be conducted simultaneously. The disclosure has been described in detail with particular reference to certain embodiments thereof, but it will be understood that variations and modifications can be effected within the spirit and scope of the disclosure.

PARTS LIST

A cross-section line
$L_C$ component connection length
$L_E$ element length
$L_T$ transistor length
P1, P2, P3, P4, P5 portions
R1, R2 connection points
S separation distance
W width
10 support substrate
12 electronic circuit
14 heat conductor
16 contact pad
20 component
20A first component
20B second component
20C third component
20D fourth component
21 component transistor
22 source
24 gate/interface
26 drain
28 component stack
30 component connection
32 component source connection
34 component gate connection
36 component drain connection
40 transistor element
41 transistor electrode
42 source electrode
44 gate electrode
46 drain electrode
50 connection post
52 fractured component tether
54 component via
56 component substrate
57 common component substrate/common die
58 dielectric structure
60 component source wafer
62 component tether
64 anchor
66 sacrificial portion
68 sacrificial layer
70 encapsulation layer/planarization layer
80 conductor
90 serpentine transistor
92 interdigitated transistor
98 die
99 multi-component transistor structure
100 provide component source substrate
110 form components step
120 form component connections step
130 optional integrate into system step
140 provide support substrate step
150 transfer components to support substrate step
152 transfer components to transferred components step

What is claimed:

1. A multi-component transistor structure, comprising:
components each comprising a component transistor, the component transistor comprising a transistor element having a transistor element resistance; and
a component connection disposed external to the transistor element of each of the components, the component connection having a connection resistance, the component connection electrically connecting the transistor element in each of the components in parallel,
wherein the connection resistance is less than the transistor element resistance of the transistor element of at least one of the components,
the component transistors are functionally similar, and
at least one of the components is disposed on another different one of the components in a component stack,
wherein one or more of the components comprises a bare die.

2. The multi-component transistor structure of claim 1, comprising a support substrate, wherein at least one of the components is disposed on the support substrate.

3. The multi-component transistor structure of claim 2, wherein the support substrate is a silicon support substrate comprising an electronic circuit that is electrically connected to one or more of the components.

4. The multi-component transistor structure of claim 1, wherein the connection resistance is less than a sum of the transistor element resistance of each of the components.

5. The multi-component transistor structure of claim 1, wherein all of the components are disposed in the component stack and the component stack is an offset component stack having at least one component with an unaligned component edge.

6. The multi-component transistor structure of claim 1, wherein all of the components are disposed in the component stack with one or more aligned edges.

7. The multi-component transistor structure of claim 1, wherein the component connection is disposed at least partly through component vias in the components in the component stack.

8. The multi-component transistor structure of claim 1, wherein the bare die has a thickness no greater than fifty microns, no greater than twenty microns, no greater than ten microns, or no greater than five microns.

9. The multi-component transistor structure of claim 1, wherein the transistor element in at least one of the components is linear.

10. The multi-component transistor structure of claim 1, wherein the component transistor comprises a gate, a source, or a drain and the transistor element is one of the gate, source, or drain.

11. The multi-component transistor structure of claim 10, wherein the component transistor comprises a gate, a source, and a drain that are each a transistor element.

12. A multi-component transistor structure, comprising:
components each comprising a component transistor, the component transistor comprising a transistor element having a transistor element resistance; and
a component connection disposed external to the transistor element of each of the components, the component connection having a connection resistance, the component connection electrically connecting the transistor element in each of the components in parallel,
wherein the connection resistance is less than the transistor element resistance of the transistor element of at least one of the components,
the component transistors are functionally similar, and
at least one of the components is disposed on another different one of the components in a component stack,
wherein all of the components are disposed in the component stack and the component stack is an offset component stack having at least one component with an unaligned component edge, and
wherein the offset component stack exposes at least a portion of the transistor element of each of the components and the component connection is disposed at least partly along and in electrical contact with the exposed portion of the transistor element.

13. A multi-component transistor structure, comprising:
components each comprising a component transistor, the component transistor comprising a transistor element having a transistor element resistance; and
a component connection disposed external to the transistor element of each of the components, the component connection having a connection resistance, the component connection electrically connecting the transistor element in each of the components in parallel,
wherein the connection resistance is less than the transistor element resistance of the transistor element of at least one of the components,
the component transistors are functionally similar, and
at least one of the components is disposed on another different one of the components in a component stack,
wherein the component connection is disposed at least partly through component vias in the components in the component stack, and
wherein the component connection in the component via has a cross section aspect ratio greater than one taken in a plane parallel to a surface of the support substrate.

14. A multi-component transistor structure, comprising:
components each comprising a component transistor, the component transistor comprising a transistor element having a transistor element resistance; and
a component connection disposed external to the transistor element of each of the components, the component connection having a connection resistance, the component connection electrically connecting the transistor element in each of the components in parallel,
wherein the connection resistance is less than the transistor element resistance of the transistor element of at least one of the components,
the component transistors are functionally similar, and
at least one of the components is disposed on another different one of the components in a component stack,
wherein the component stack comprises at least a first lower row of components and a second upper row of components disposed on the first lower row of components, and wherein
(i) the second upper row comprises fewer components than the first lower row, or
(ii) at least some components in the second upper row are smaller than the components in the first lower row, or
(iii) both (i) and (ii).

15. A multi-component transistor structure, comprising:
components each comprising a component transistor, the component transistor comprising a transistor element having a transistor element resistance; and
a component connection disposed external to the transistor element of each of the components, the component connection having a connection resistance, the component connection electrically connecting the transistor element in each of the components in parallel,
wherein the connection resistance is less than the transistor element resistance of the transistor element of at least one of the components,
the component transistors are functionally similar, and
at least one of the components is disposed on another different one of the components in a component stack,
wherein the components are substantially identical, are substantially identical in size, or are substantially identical in material(s).

16. A multi-component transistor structure, comprising:
components each comprising a component transistor, the component transistor comprising a transistor element having a transistor element resistance; and
a component connection disposed external to the transistor element of each of the components, the component connection having a connection resistance, the component connection electrically connecting the transistor element in each of the components in parallel, wherein the connection resistance is less than the transistor element resistance of the transistor element of at least one of the components, the component transistors are functionally similar, and at least one of the components is disposed on another different one of the components in a component stack, wherein each of the components comprises an individual, discrete, and separate component substrate that comprises a compound semiconductor material.

17. A multi-component transistor structure, comprising:

components each comprising a component transistor, the component transistor comprising a transistor element having a transistor element resistance; and a component connection disposed external to the transistor element of each of the components, the component connection having a connection resistance, the component connection electrically connecting the transistor element in each of the components in parallel, wherein the connection resistance is less than the transistor element resistance of the transistor element of at least one of the components, the component transistors are functionally similar, and at least one of the components is disposed on another different one of the components in a component stack, wherein the transistor element in at least one of the components is serpentine.

18. A multi-component transistor structure, comprising:

components each comprising a component transistor, the component transistor comprising a transistor element having a transistor element resistance; and a component connection disposed external to the transistor element of each of the components, the component connection having a connection resistance, the component connection electrically connecting the transistor element in each of the components in parallel, wherein the connection resistance is less than the transistor element resistance of the transistor element of at least one of the components, the component transistors are functionally similar, and at least one of the components is disposed on another different one of the components in a component stack, wherein the component transistor comprises a gate, a source, or a drain and the transistor element is one of the gate, source, or drain, wherein the component transistor comprises a gate, a source, and a drain that are each a transistor element, and wherein, for at least one of the components, at least one of the transistor elements is interdigitated with another different one of the multiple transistor elements.

19. A multi-component transistor structure, comprising:

components each comprising a component transistor, the component transistor comprising a transistor element having a transistor element resistance; and a component connection disposed external to the transistor element of each of the components, the component connection having a connection resistance, the component connection electrically connecting the transistor element in each of the components in parallel, wherein the connection resistance is less than the transistor element resistance of the transistor element of at least one of the components, the component transistors are functionally similar, and at least one of the components is disposed on another different one of the components in a component stack, wherein the component transistor comprises a gate, a source, or a drain and the transistor element is one of the gate, source, or drain, wherein the component transistor comprises a gate, a source, and a drain that are each a transistor element, and wherein the gate, the source, and the drain in each of the components are respectively electrically connected in parallel with a different and separate component connection having a connection resistance.

20. The multi-component transistor structure of claim 19, wherein the connection resistance of the different and separate component connection is less than a transistor element resistance of each gate or source, or a transistor element resistance to which the different and separate component connection is connected.

* * * * *